United States Patent
Nishi et al.

(10) Patent No.: US 6,835,525 B2
(45) Date of Patent: Dec. 28, 2004

(54) POLYMER, RESIST COMPOSITION AND PATTERNING PROCESS

(75) Inventors: Tsunehiro Nishi, Nakakubiki-gun (JP); Mutsuo Nakashima, Nakakubiki-gun (JP); Seiichiro Tachibana, Nakakubiki-gun (JP); Kenji Funatsu, Nakakubiki-gun (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 121 days.

(21) Appl. No.: 10/073,223

(22) Filed: Feb. 13, 2002

(65) Prior Publication Data

US 2002/0150835 A1 Oct. 17, 2002

(30) Foreign Application Priority Data

Feb. 14, 2001 (JP) ........................................ 2001-037247
Feb. 14, 2001 (JP) ........................................ 2001-037262
Feb. 14, 2001 (JP) ........................................ 2001-037271

(51) Int. Cl.$^7$ .................... G03F 7/038; G03F 7/039; G03F 7/20; G03F 7/30; C08F 220/18

(52) U.S. Cl. .................... 430/270.1; 430/905; 430/909; 430/910; 430/325; 430/326; 430/327; 430/328; 430/330; 430/331; 430/296; 526/329.6; 526/328; 526/328.5; 526/280; 526/281; 526/332; 526/333; 526/266; 526/268

(58) Field of Search .............................. 430/270.1, 905, 430/909, 910, 325, 326, 327, 328, 331, 330, 287.1, 296; 526/328.5, 329.6, 268, 266, 281, 332, 333, 328, 280

(56) References Cited

U.S. PATENT DOCUMENTS 5,968,713 A * 10/1999 Nozaki et al. ............... 430/326
6,512,067 B2 * 1/2003 Nishi et al. .................. 526/266
6,670,094 B2 * 12/2003 Nishi et al. ............... 430/270.1
6,673,517 B2 * 1/2004 Nishi et al. ............... 430/270.1

* cited by examiner

Primary Examiner—Cynthia H. Kelly
Assistant Examiner—Sin J. Lee
(74) Attorney, Agent, or Firm—Millen, White, Zelano & Branigan, P.C.

(57) ABSTRACT

A novel polymer is obtained by copolymerizing a (meth) acrylic acid derivative with a vinyl ether compound, an allyl ether compound and an oxygen-containing alicyclic olefin compound. A resist composition comprising the polymer as a base resin is sensitive to high-energy radiation, has excellent sensitivity, resolution, etching resistance, and minimized swell and lends itself to micropatterning with electron beams or deep-UV.

14 Claims, No Drawings

POLYMER, RESIST COMPOSITION AND PATTERNING PROCESS

This invention relates to (i) a polymer having a specific structure, (ii) a resist composition comprising the polymer as a base resin, and (iii) a patterning process using the resist composition.

BACKGROUND OF THE INVENTION

While a number of recent efforts are being made to achieve a finer pattern rule in the drive for higher integration and operating speeds in LSI devices, deep-ultraviolet lithography is thought to hold particular promise as the next generation in microfabrication technology. In particular, photolithography using a KrF or ArF excimer laser as the light source is strongly desired to reach the practical level as the micropatterning technique capable of achieving a feature size of 0.3 μm or less.

For resist materials for use with a KrF excimer lasers, polyhydroxystyrene having a practical level of transparency and etching resistance is, in fact, a standard base resin. For resist materials for use with ArF excimer lasers, polyacrylic or polymethacrylic acid derivatives and polymers containing aliphatic cyclic compounds in the backbone are under investigation. All these polymers have advantages and disadvantages, and none of them have been established as the standard base resin.

More particularly, resist compositions using derivatives of polyacrylic or polymethacrylic acid have the advantages of high reactivity of acid-decomposable groups and good substrate adhesion and give relatively satisfactory results with respect to sensitivity and resolution, but have extremely low etching resistance and are impractical because the resin backbone is weak. On the other hand, resist compositions using polymers containing alicyclic compounds in their backbone have a practically acceptable level of etching resistance because the resin backbone is robust, but are very low in sensitivity and resolution because the reactivity of acid-decomposable protective groups is extremely low as compared with those on the (meth)acrylic polymers. Since the backbone of the resin is too robust, substrate adhesion is poor. These compositions are thus impractical as well.

Both the (meth)acrylic and alicyclic backbone systems commonly have the problem of pattern disruption due to swelling of resist film. Resist compositions based on these systems have been designed so as to improve their resolution performance by increasing the difference in dissolution rate before and after exposure, and as a consequence, they eventually become highly hydrophobic. Highly hydrophobic resist compositions, when applied as a film and processed with a developer, can maintain the film tenaciously in unexposed regions and allow the film to be instantaneously dissolved in over-exposed regions, while relatively broad exposed regions therebetween allow penetration of the developer, but are kept undissolved, that is, swollen. At the very small pattern size for which ArF excimer laser is actually used, those resist compositions which allow adjacent pattern strips to be joined together and disrupted on account of swelling are rejected. While a finer pattern rule is being demanded, there is a need to have a resist material which is not only satisfactory in sensitivity, resolution, and etching resistance, but fully restrained from swelling.

SUMMARY OF THE INVENTION

Therefore, an object of the present invention is to provide (i) a polymer having improved reactivity, robustness and substrate adhesion as well as minimized swell during development, (ii) a resist composition comprising the polymer as a base resin, which has a higher resolution and etching resistance than conventional resist compositions, and (iii) a patterning process using the resist composition.

It has been found that novel polymers comprising recurring units of the following general formula (1) and having a weight average molecular weight of 1,000 to 500,000, which are produced by the method to be described later, have improved reactivity, robustness or rigidity and substrate adhesion as well as an appropriately high solubility and minimized swell in a developer; that a resist composition comprising the polymer as the base resin has a high resolution and etching resistance; and that this resist composition lends itself to precise micropatterning.

In a first aspect, the invention provides a polymer comprising recurring units of the following general formula (1) and having a weight average molecular weight of 1,000 to 500,000:

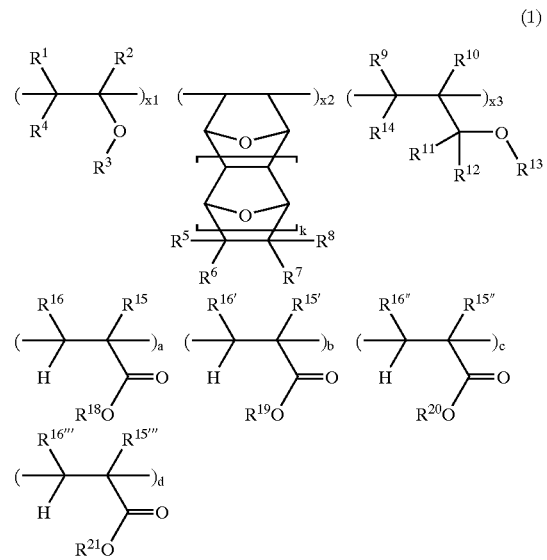

(1)

Herein $R^1$ and $R^2$ each are hydrogen or methyl; $R^3$ and $R^4$ each are hydrogen or a straight, branched or cyclic, monovalent hydrocarbon group of 1 to 15 carbon atoms which may contain a hetero atom, and $R^3$ and $R^4$ may bond together to form a ring, wherein $R^3$ and $R^4$ together represent a straight, branched or cyclic, divalent hydrocarbon group of 1 to 15 carbon atoms which may contain a hetero atom; each of $R^5$ to $R^8$ is hydrogen, a hydroxyl group or a straight, branched or cyclic, monovalent hydrocarbon group of 1 to 15 carbon atoms which may contain a hetero atom, at least one of $R^5$ to $R^8$ contains a hetero atom, any two of $R^5$ to $R^8$ may bond together to form a ring, wherein the ring-forming two R's together represent a straight, branched or cyclic, divalent hydrocarbon group of 1 to 15 carbon atoms which may contain a hetero atom; $R^9$ and $R^{10}$ each are hydrogen or methyl; each of $R^{11}$ to $R^{14}$ is hydrogen or a straight, branched or cyclic, monovalent hydrocarbon group of 1 to 15 carbon atoms which may contain a hetero atom, a pair of $R^{11}$ and $R^{12}$, a pair of $R^{11}$ or $R^{12}$ and $R^{13}$, a pair of $R^{11}$ and $R^{14}$, or a pair of $R^{13}$ and $R^{14}$ may bond together to form a ring, wherein each pair represents a straight, branched or cyclic, divalent hydrocarbon group of 1 to 15 carbon atoms which may contain a hetero atom; $R^{15}$ is hydrogen, methyl or $CH_2CO_2R^{17}$; $R^{15'}$ is hydrogen, methyl or $CH_2CO_2R^{17'}$; $R^{15''}$ is hydrogen, methyl or $CH_2CO_2R^{17''}$; $R^{15'''}$ is hydrogen, methyl or $CH_2CO_2R^{17'''}$; $R^{16}$ is hydrogen, methyl or $CO_2 R^{17}$; $R^{16'}$ is hydrogen, methyl or $CO_2R^{17'}$; $R^{16''}$ is hydrogen, methyl or $CO_2R^{17''}$; $R^{16'''}$ is hydrogen, methyl or $CO_2R^{17'''}$; $R^{17}$, $R^{17'}$, $R^{17''}$ and $R^{17'''}$ may be identical or different between $R^{15}$ and $R^{16}$, between $R^{15'}$ and $R^{16'}$, between $R^{15''}$ and $R^{16''}$, and between $R^{15'''}$ and $R^{16'''}$, respectively, and each is a straight, branched or cyclic alkyl group of 1 to 15 carbon atoms; $R^{18}$ is hydrogen or a monovalent hydrocarbon group of 1 to 15 carbon atoms containing a carboxyl or hydroxyl group; $R^{19}$ is a monovalent hydrocarbon group of 2 to 15 carbon atoms containing at least one partial structure selected from the group consisting of ether, aldehyde, ketone, ester, carbonate, acid anhydride, amide and imide; $R^{20}$ is a polycyclic hydrocarbon group of 7 to 15 carbon atoms or an alkyl group containing a polycyclic hydrocarbon group; $R^{21}$ is an acid labile group; k is 0 or 1; x1, x2, x3, a, b, c and d represent a molar compositional ratio of the recurring units associated therewith, satisfying x1+x2+x3+a+b+c+d=1, x1, x2, x3, a, b and c are numbers inclusive of 0, d is a number of more than 0, all of x1, x2 and x3 are not equal to 0 at the same time. Preferably, the acid labile group represented by $R^{21}$ in formula (1) is a tertiary alkyl group having a cyclic structure.

In a second aspect, the invention provides a resist composition comprising the polymer defined above.

In a third aspect, the invention provides a process for forming a resist pattern comprising the steps of applying the resist composition defined above onto a substrate to form a coating; heat treating the coating and then exposing it to high-energy radiation or electron beams through a photo mask; and optionally heat treating the exposed coating and developing it with a developer.

The polymer comprising recurring units of formula (1) is a polymer based on a (meth)acrylic acid derivative, which is copolymerized with at least one of a vinyl ether compound, an allyl ether compound, a norbornene derivative containing an oxygen atom within its ring, and a tetracyclododecene derivative containing an oxygen atom within its ring. As pointed out above, polymers of (meth)acrylic acid derivatives have good sensitivity and resolution, but poor etching resistance, partly because of many ester bonds and a low carbon density. By changing some of the copolymerized units to the above-mentioned units, the polymer of the invention has succeeded in improving etching resistance without sacrificing the sensitivity and resolution characteristic of the (meth)acrylic acid derivative polymers. And the inventive polymer drastically suppresses the occurrence of undesired phenomena including developer repellency, swelling upon development, and pattern disruption as often found when alicyclic rings are introduced into the backbone. Therefore, a resist composition using the inventive polymer as a base resin satisfies all the performance factors of sensitivity, resolution and etching resistance, is fully restrained from swelling upon development, and is thus very useful in forming micropatterns.

It is noted that hybrid polymers analogous to the inventive polymer are known in the art, including hybrid polymers in which alicyclic olefin compound (e.g., norbornene)-maleic anhydride alternating copolymers are copolymerized with (meth)acrylic acid derivative units and hybrid polymers in which vinyl ether-maleic anhydride alternating copolymers are copolymerized with (meth)acrylic acid derivative units. It has been proposed to use these hybrid polymers as the base resin in resist compositions. These hybrid polymers contain maleic anhydride as an essential unit. However, the maleic anhydride units can adversely affect etching resistance on account of a high oxygen content, and react with water within the system during shelf storage, with the performance of the resist composition being markedly degraded by this ring opening reaction. The inventive polymer, which is obtained by introducing a vinyl ether compound, an allyl ether compound and an oxygen-containing alicyclic olefin compound into a (meth)acrylic acid derivative polymer, rather than introducing maleic anhydride, is not only improved in sensitivity, resolution and etching resistance, but also has excellent storage stability.

DESCRIPTION OF THE PREFERRED EMBODIMENTS

Polymer

Polymers or high molecular weight compounds comprising recurring units of the following general formula (1) according to the invention are novel. The polymers have a weight average molecular weight of 1,000 to 500,000.

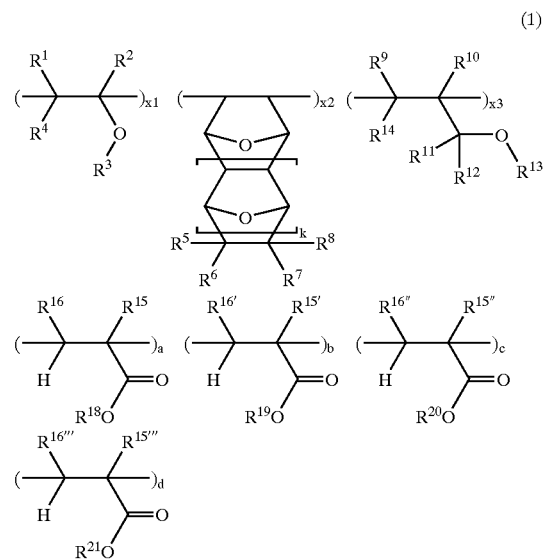

Herein $R^1$, and $R^2$ each are hydrogen or methyl.

$R^3$ and $R^4$ each are hydrogen or a straight, branched or cyclic, monovalent hydrocarbon group of 1 to 15 carbon atoms which may contain a hetero atom. Examples include alkyl groups such as methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, and butyladamantyl. Also included are the foregoing groups in which some of the hydrogen atoms are replaced by a group of hetero atoms, or a group of hetero atoms intervenes between adjacent carbon atoms, that is, groups having a partial structure such as alcohol, ether, aldehyde, ketone, carboxylic acid, ester, carboxylic anhydride, amide, sulfonic acid, sulfonate or sulfonamide. $R^3$ and $R^4$ may bond together to form a ring. In that event, a combination of $R^3$ with $R^4$ represents a straight, branched or cyclic, divalent hydrocarbon group of 1 to 15 carbon atoms which may contain a hetero atom, examples of which are divalent groups obtained by eliminating a hydrogen atom at an arbitrary position from the groups exemplified above as the monovalent hydrocarbon groups which may contain a hetero atom.

Each of $R^5$ to $R^8$ is hydrogen, a hydroxyl group or a straight, branched or cyclic, monovalent hydrocarbon group of 1 to 15 carbon atoms which may contain a hetero atom, and at least one of $R^5$ to $R^8$ contains a hetero atom.

Examples of the hydrocarbon group are the same as exemplified above for $R^3$ and $R^4$. Any two of $R^5$ to $R^8$ may bond together to form a ring. In that event, the combination of ring-forming two R's represents a straight, branched or cyclic, divalent hydrocarbon group of 1 to 15 carbon atoms which may contain a hetero atom, examples of which are the same as exemplified above for $R^3$ and $R^4$.

$R^9$ and $R^{10}$ each are hydrogen or methyl.

Each of $R^{11}$ to $R^{14}$ is hydrogen or a straight, branched or cyclic, monovalent hydrocarbon group of 1 to 15 carbon atoms which may contain a hetero atom, examples of which are the same as exemplified above for $R^3$ and $R^4$. A pair of $R^{11}$ and $R^{12}$, a pair of $R^{11}$ or $R^{12}$ and $R^{13}$, a pair of $R^{11}$ or $R^{12}$ and $R^{14}$, or a pair of $R^{13}$ and $R^{14}$ may bond together to form a ring. In that event, each pair represents a straight, branched or cyclic, divalent hydrocarbon group of 1 to 15 carbon atoms which may contain a hetero atom, examples of which are the same as exemplified above for $R^3$ and $R^4$.

$R^{15}$ is hydrogen, methyl or $CH_2CO_2R^{17}$, $R^{15'}$ is hydrogen, methyl or $CH_2CO_2R^{17'}$, $R^{15''}$ is hydrogen, methyl or $CH_2CO_2R^{17''}$, $R^{15'''}$ is hydrogen, methyl or $CH_2CO_2R^{17'''}$, $R^{16}$ is hydrogen, methyl or $CO_2R^{17}$, $R^{16'}$ is hydrogen, methyl or $CO_2R^{17'}$, $R^{16''}$ is hydrogen, methyl or $CO_2R^{17''}$, and $R^{16'''}$ is hydrogen, methyl or $CO_2R^{17'''}$. $R^{17}$, $R^{17'}$, $R^{17''}$ and $R^{17'''}$ may be identical or different between $R^{15}$ and $R^{16}$, between $R^{15'}$ and $R^{16'}$, between $R^{15''}$ and $R^{16''}$, and between $R^{15'''}$ and $R^{16'''}$, respectively, and each is a straight, branched or cyclic alkyl group of 1 to 15 carbon atoms, examples of which are the same as exemplified above for $R^3$ and $R^4$.

$R^{18}$ is hydrogen or a monovalent hydrocarbon group of 1 to 15 carbon atoms containing a carboxyl or hydroxyl group. Examples include carboxyethyl, carboxybutyl, carboxycyclopentyl, carboxycyclohexyl, carboxynorbornyl, carboxyadamantyl, hydroxyethyl, hydroxybutyl, hydroxycyclopentyl, hydroxycyclohexyl, hydroxynorbornyl, and hydroxyadamantyl.

$R^{19}$ is a monovalent hydrocarbon group of 2 to 15 carbon atoms containing at least one partial structure selected from among ether, aldehyde, ketone, ester, carbonate, acid anhydride, amide and imide. Examples include methoxymethyl, methoxyethoxymethyl, 7-oxabicyclo[2.2.1]heptan-2-ylmethyl, 2-oxooxolan-3-yl, 2-oxooxolan-4-yl, 4,4-dimethyl-2-oxooxolan-3-yl, 4-methyl-2-oxooxan-4-yl, 2-oxo-1,3-dioxolan-4-ylmethyl, and 5-methyl-2-oxooxolan-5-yl.

$R^{20}$ is a polycyclic hydrocarbon group of 7 to 15 carbon atoms or an alkyl group containing a polycyclic hydrocarbon group. Examples include norbornyl, bicyclo[3.3.1]nonyl, tricyclo[5.2.1.0$^{2,6}$]decyl, adamantyl, ethyladamantyl, butyladamantyl, norbornylmethyl, and adamantylmethyl.

$R^{21}$ is an acid labile group.

The subscript k is equal to 0 or 1. The subscripts x1, x2, x3, a, b, c and d represent a molar compositional ratio of the recurring units associated therewith, satisfying x1+x2+x3+a+b+c+d=1, x1, x2, x3, a, b and c are numbers inclusive of 0, d is a number of more than 0, all of x1, x2 and x3 are not equal to 0 at the same time. The preferred ranges of x1, x2, x3, a, b, c and d are given below.

|  | Preferred range | More preferred range |
| --- | --- | --- |
| x1: | from 0 to 0.7 | from 0 to 0.6 |
| x2: | from 0 to 0.7 | from 0 to 0.6 |
| x3: | from 0 to 0.7 | from 0 to 0.6 |

|  | Preferred range | More preferred range |
| --- | --- | --- |
| a: | from 0 to 0.4 | from 0 to 0.3 |
| b: | from 0 to 0.5 | from 0 to 0.4 |
| c: | from 0 to 0.4 | from 0 to 0.3 |
| d: | from 0.1 to 0.8 | from 0.2 to 0.7 |

The sum of x1+x2+x3 is preferably $0<x1+x2+x3\leq0.9$, more preferably $0.05\leq x1+x2+x3\leq0.7$, and even more preferably $0.1\leq x1+x2+x3\leq0.6$.

The acid labile groups represented by $R^{21}$ may be selected from a variety of such groups. Examples of the acid labile group are groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

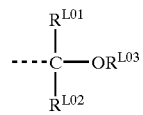

(L1)

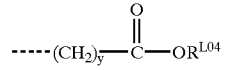

(L2)

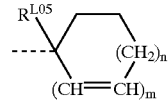

(L3)

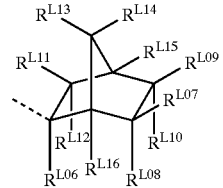

(L4)

In these formulae and throughout the specification, the broken line denotes a free valence bond. $R^{L01}$ and $R^{L02}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, and n-octyl. $R^{L03}$ is a monovalent hydrocarbon group of 1 to 18 carbon atoms, preferably 1 to 10 carbon atoms, which may contain a hetero atom such as oxygen, examples of which include unsubstituted straight, branched or cyclic alkyl groups and straight, branched or cyclic alkyl groups in which some hydrogen atoms are replaced by hydroxyl, alkoxy, oxo, amino, alkylamino or the like. Illustrative examples are the substituted alkyl groups shown below.

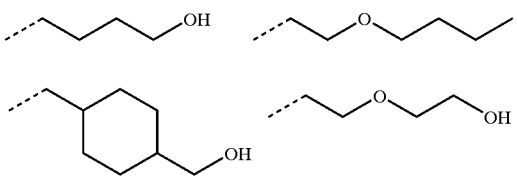

-continued

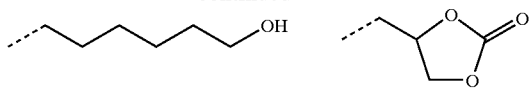

A pair of $R^{L01}$ and $R^{L02}$, $R^{L01}$ and $R^{L03}$, or $R^{L02}$ and $R^{L03}$ may form a ring. Each of $R^{L01}$, $R^{L02}$ and $R^{L03}$ is a straight or branched alkylene group of 1 to 18 carbon atoms, preferably 1 to 10 carbon atoms when they form a ring.

$R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter y is an integer of 0 to 6.

$R^{L05}$ is a monovalent hydrocarbon group of 1 to 8 carbon atoms which may contain a hetero atom or a substituted or unsubstituted aryl group of 6 to 20 carbon atoms. Examples of the monovalent hydrocarbon group which may contain a hetero atom include straight, branched or cyclic alkyl groups such as methyl, ethyl, propyl, isopropyl, n-butyl, sec-butyl, tert-butyl, tert-amyl, n-pentyl, n-hexyl, cyclopentyl, and cyclohexyl, and substituted groups in which some hydrogen atoms on the foregoing groups are substituted with hydroxyl, alkoxy, carboxy, alkoxycarbonyl, oxo, amino, alkylamino, cyano, mercapto, alkylthio, sulfo or other groups. Exemplary aryl groups are phenyl, methylphenyl, naphthyl, anthryl, phenanthryl, and pyrenyl. Letter m is equal to 0 or 1, n is equal to 0, 1, 2 or 3, and 2m+n is equal to 2 or 3.

$R^{L06}$ is a monovalent hydrocarbon group of 1 to 8 carbon atoms which may contain a hetero atom or a substituted or unsubstituted aryl group of 6 to 20 carbon atoms. Examples of these groups are the same as exemplified for $R^{L05}$.

$R^{L07}$ to $R^{L16}$ independently represent hydrogen or monovalent hydrocarbon groups of 1 to 15 carbon atoms which may contain a hetero atom. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted ones of these groups in which some hydrogen atoms are replaced by hydroxyl, alkoxy, carboxy, alkoxycarbonyl, oxo, amino, alkylamino, cyano, mercapto, alkylthio, sulfo or other groups. Alternatively, $R^{L07}$ to $R^{L16}$, taken together, form a ring (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, or a similar pair form a ring). Each of $R^{L07}$ to $R^{L16}$ represents a divalent $C_1$–$C_{15}$ hydrocarbon group which may contain a hetero atom, when they form a ring, examples of which are the ones exemplified above for the monovalent hydrocarbon groups, with one hydrogen atom being eliminated. Two of $R^{L07}$ to $R^{L16}$ which are attached to adjoining carbon atoms (for example, a pair of $R^{L07}$ and $R^{L09}$, $R^{L09}$ and $R^{L15}$, $R^{L13}$ and $R^{L15}$, or a similar pair) may bond together directly to form a double bond.

Of the acid labile groups of formula (L1), the straight and branched ones are exemplified by the following groups.

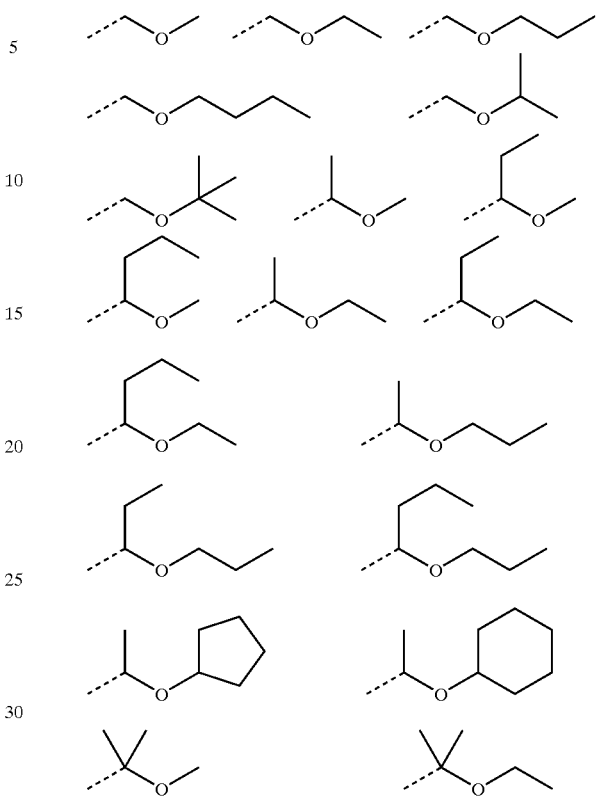

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxy-carbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl groups.

The acid labile groups of formula (L4) are exemplified by the following groups.

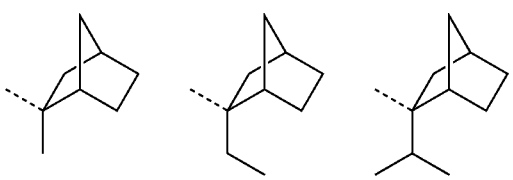

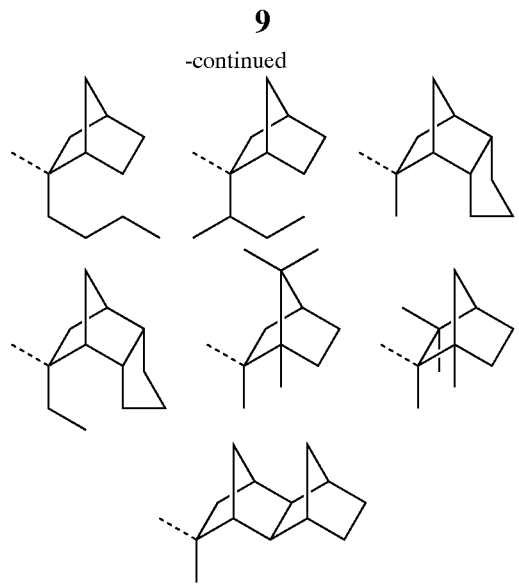

Examples of the tertiary alkyl groups of 4 to 20 carbon atoms, trialkylsilyl groups in which each alkyl moiety has 1 to 6 carbon atoms, and oxoalkyl groups of 4 to 20 carbon atoms are as exemplified for $R^{L04}$.

Of the groups exemplified as the acid labile group of $R^{21}$, tertiary alkyl groups having a cyclic structure are especially preferred. This is because the relatively low deblocking reactivity of tertiary alkyl groups under acidic conditions makes the polymer fully stable during storage and because the inclusion of cyclic structure makes the polymer more rigid and hence, well resistant to etching.

Illustrative, non-limiting examples of the unit to be introduced into the polymer of formula (1) in the molar compositional ratio x1 are shown below:

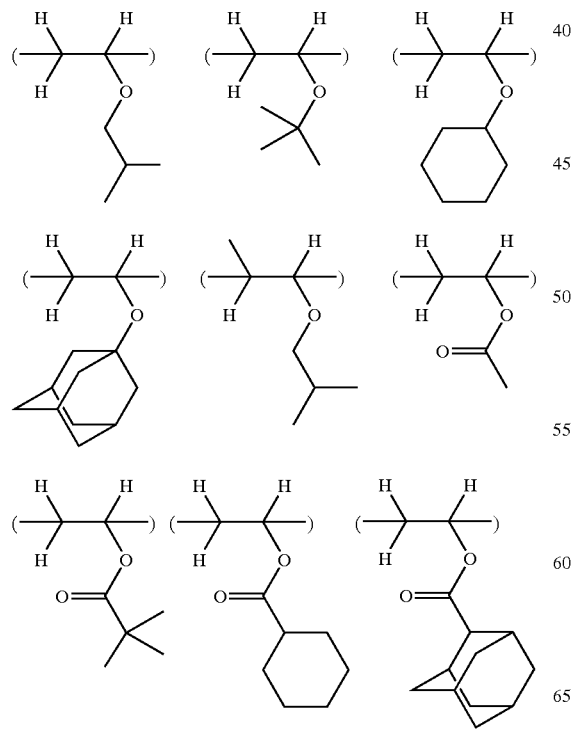

Illustrative, non-limiting examples of the unit to be introduced into the polymer of formula (1) in the molar compositional ratio x2 are shown below:

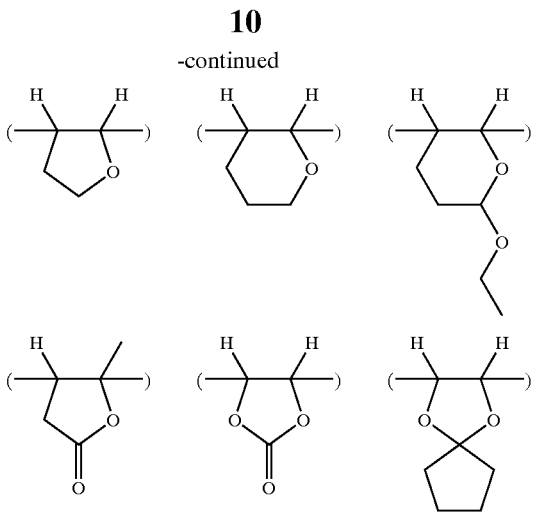

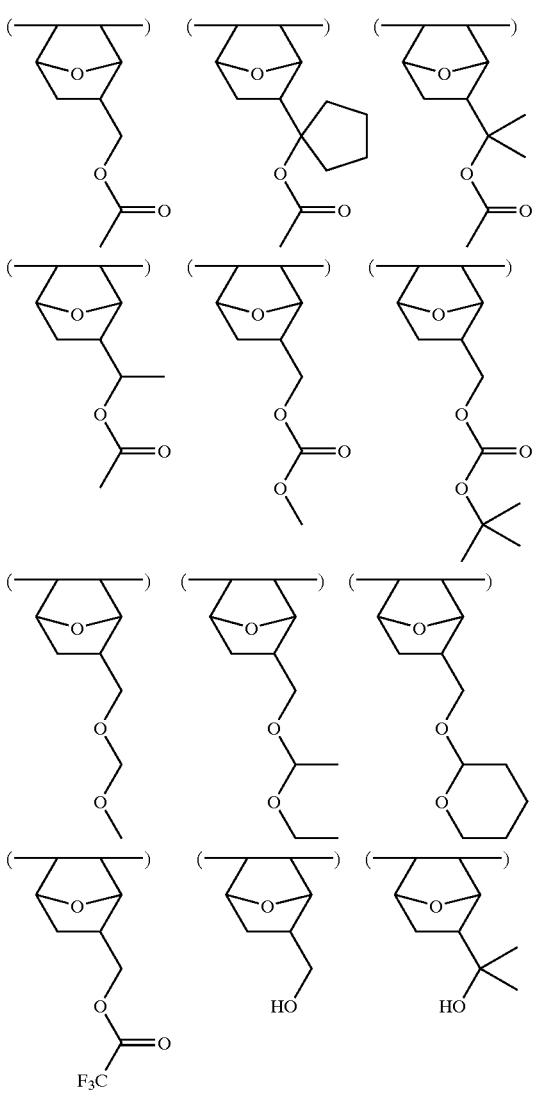

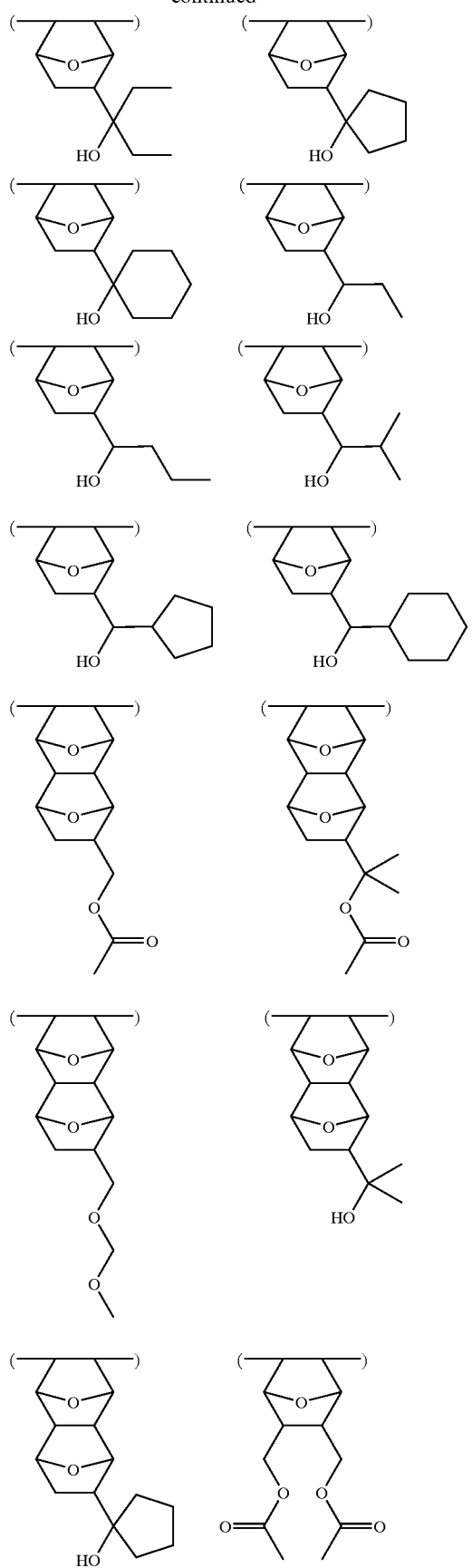
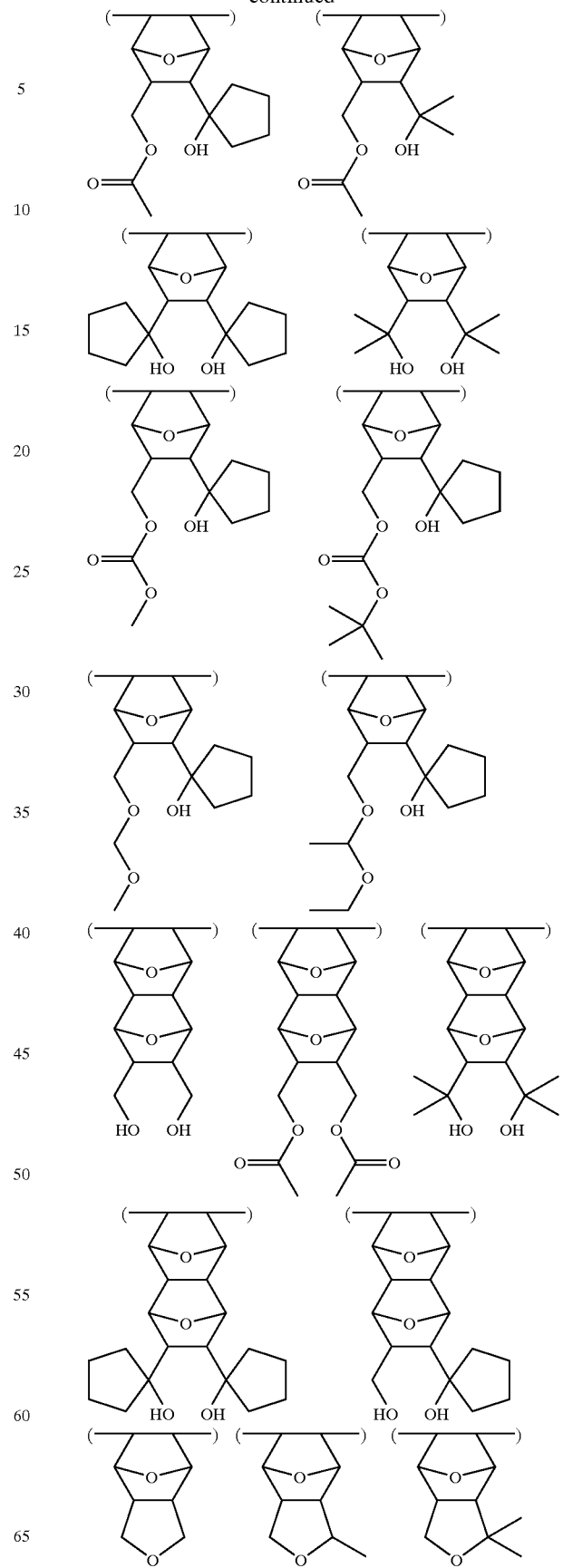

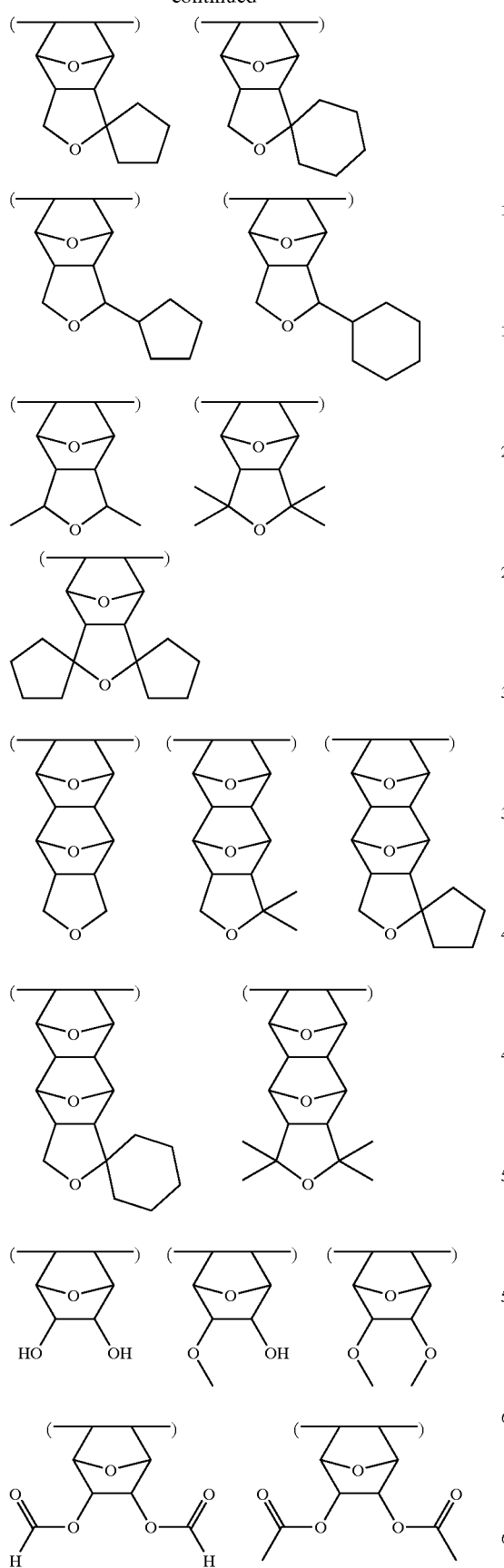
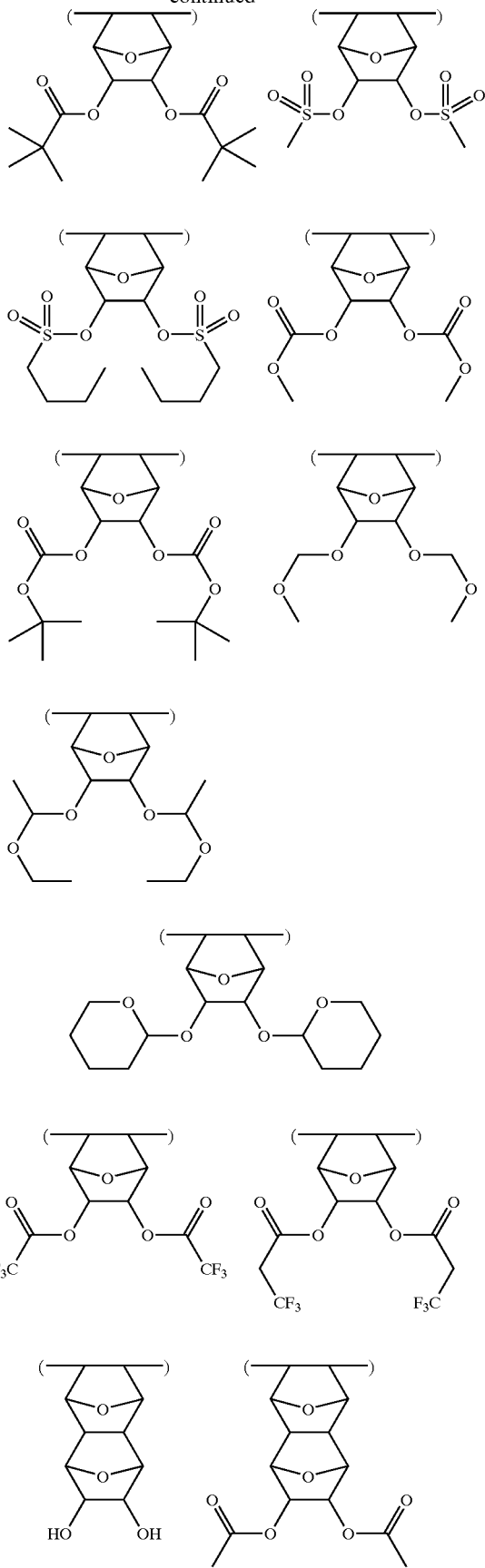

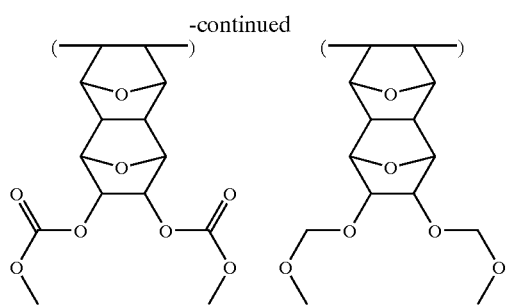
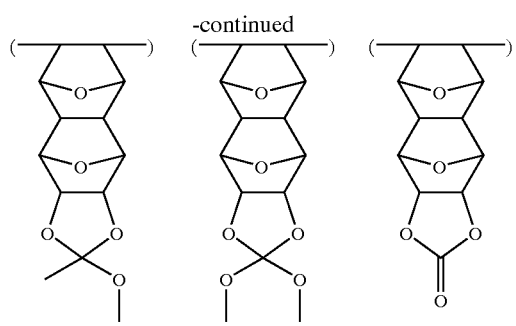
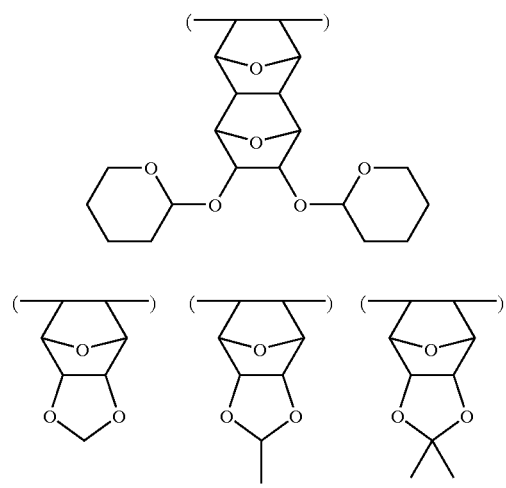
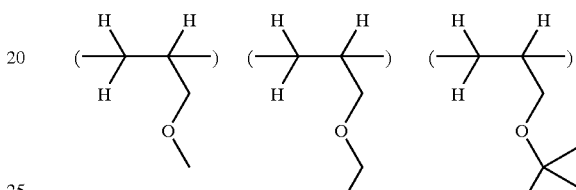
Illustrative, non-limiting examples of the unit to be introduced into the polymer of formula (1) in the molar compositional ratio x3 are shown below:
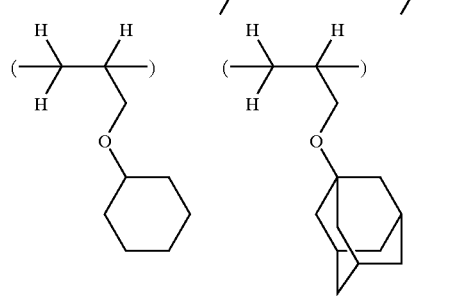
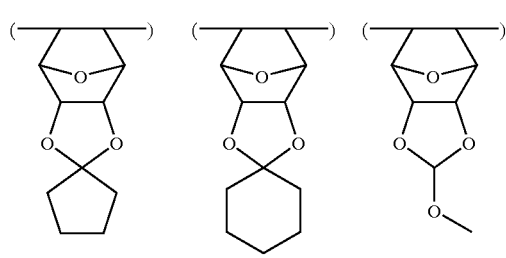
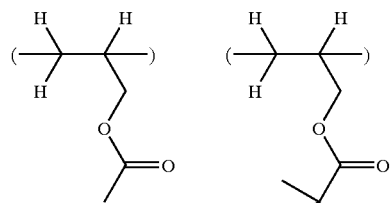
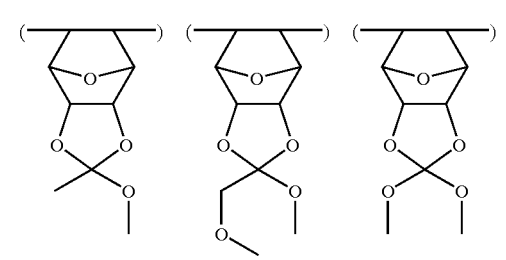
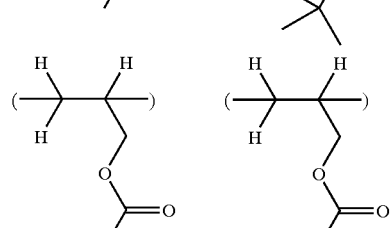
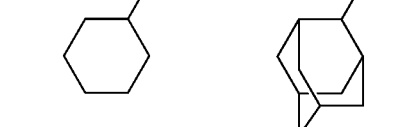
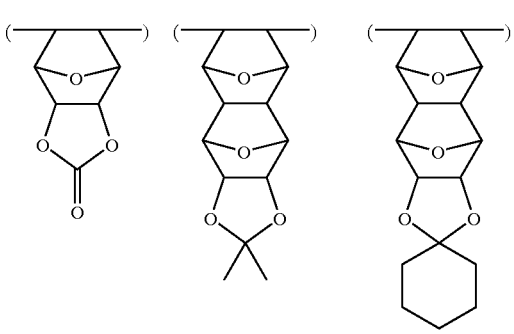
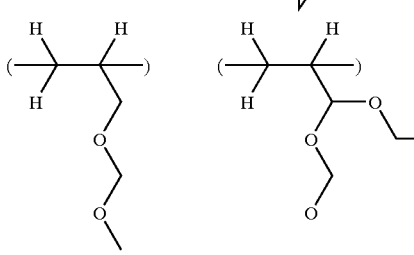

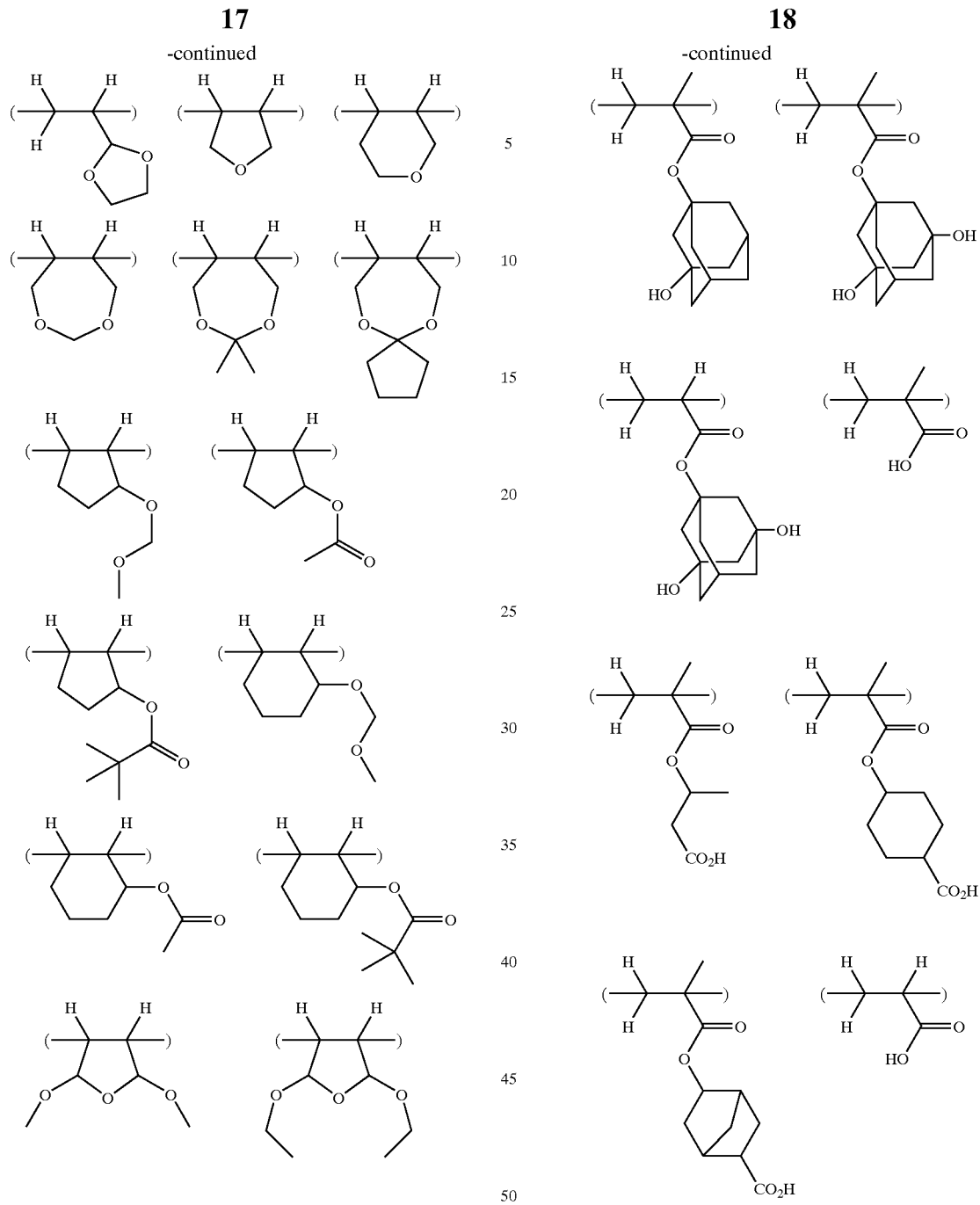
Illustrative, non-limiting examples of the unit to be introduced into the polymer of formula (1) in the molar compositional ratio "a" are shown below:
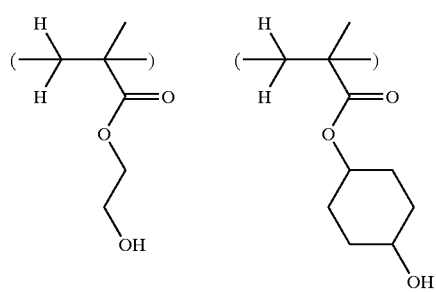
Illustrative, non-limiting examples of the unit to be introduced into the polymer of formula (1) in the molar compositional ratio "b" are shown below:
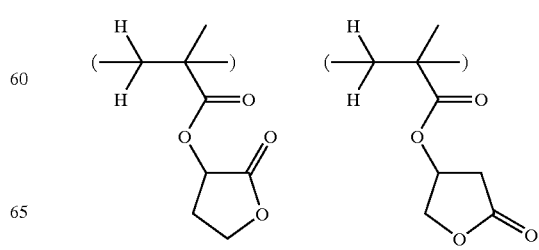

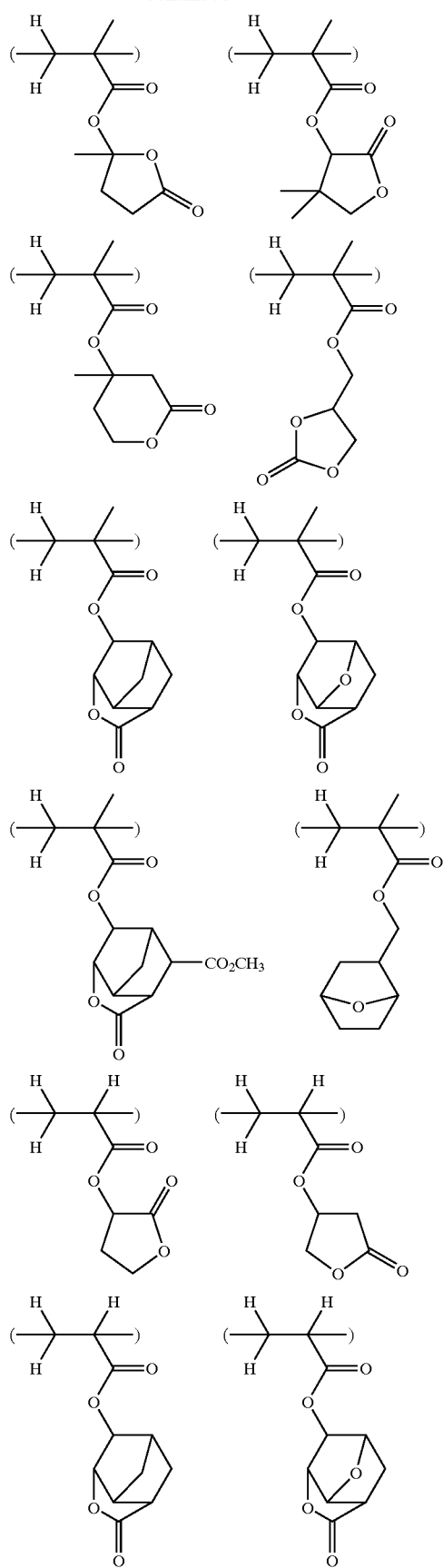
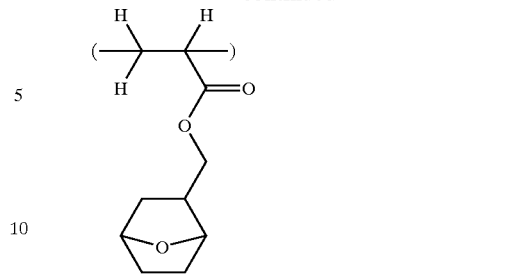
Illustrative, non-limiting examples of the unit to be introduced into the polymer of formula (1) in the molar compositional ratio "c" are shown below:
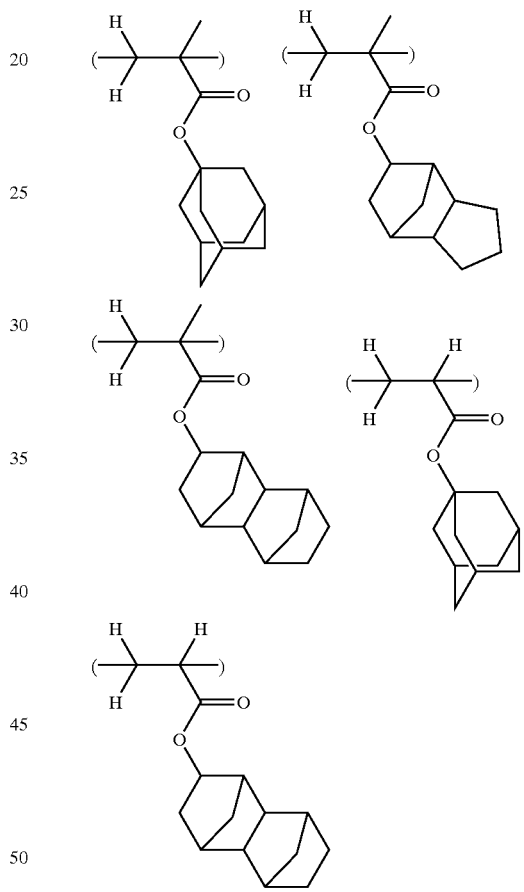
Illustrative, non-limiting examples of the unit to be introduced into the polymer of formula (1) in the molar compositional ratio "d" are shown below:
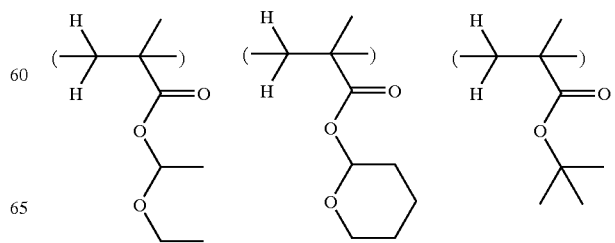

-continued

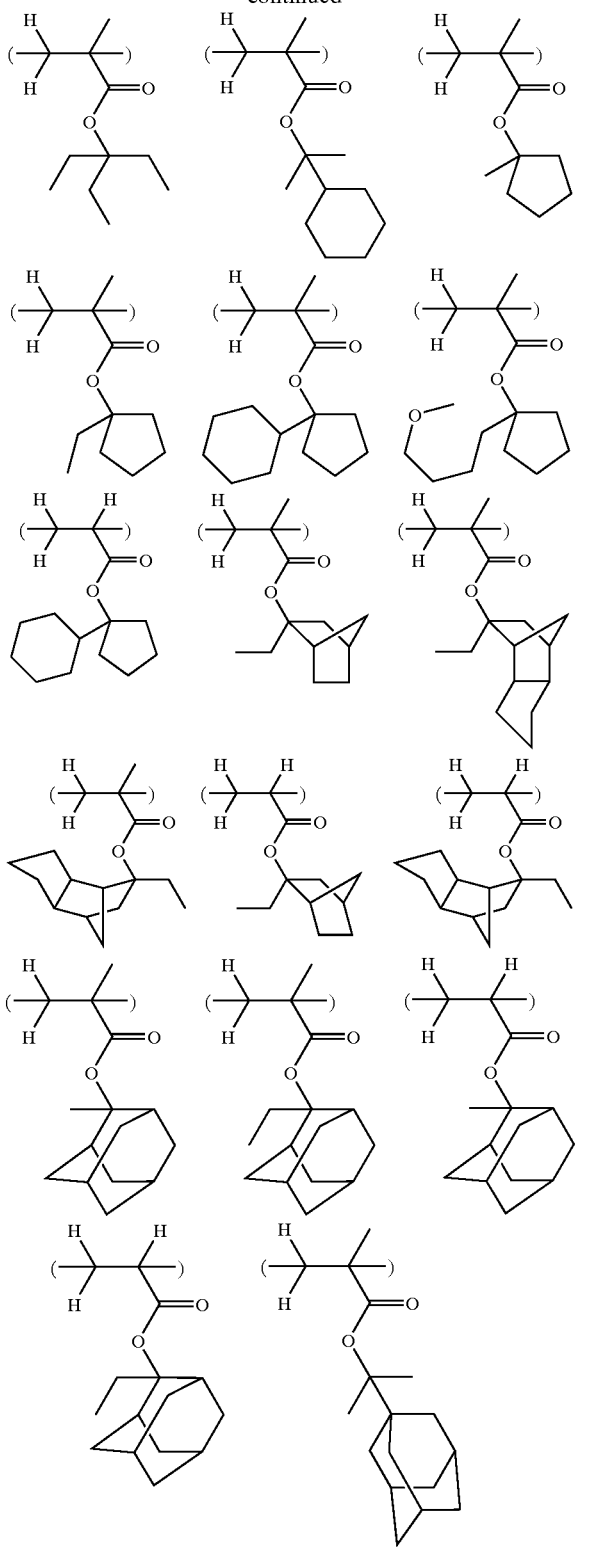

Each of the recurring units described above is to impart any appropriate properties such as dissolution contrast, developer affinity, substrate adhesion and etching resistance to a resist composition into which the polymer is formulated. By properly adjusting the content of such recurring units, the performance of the resist composition can be finely adjusted.

The polymers of the invention have a weight average molecular weight of about 1,000 to 500,000, and preferably about 3,000 to 100,000, as measured by gel permeation chromatography (GPC) using a polystyrene standard. Outside the range, the etching resistance may become extremely low and the resolution may become low because a substantial difference in rate of dissolution before and after exposure is lost.

The polymer of the invention can be prepared through copolymerization reaction using one, two or three members selected from compounds of the following general formulae (2) to (4) as first to third monomers, a compound of the following general formula (8) as a next monomer, and optionally, one, two or three members selected from compounds of the following general formulae (5) to (7) as subsequent monomers:

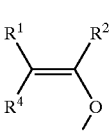

(2)

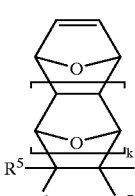

(3)

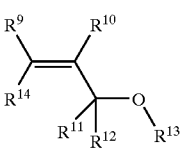

(4)

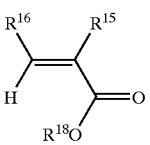

(5)

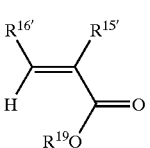

(6)

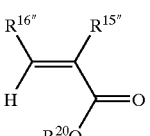

(7)

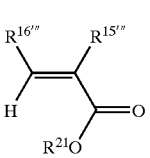

(8)

Herein, $R^1$ to $R^{21}$, $R^{15'}$, $R^{15''}$, $R^{15'''}$, $R^{16'}$, $R^{16''}$, $R^{16'''}$, x1, x2, x3, a, b, c and d are as defined above.

By properly adjusting the proportion of the respective monomers used in the copolymerization reaction, the polymer can be tailored so that it may exert the preferred performance when blended in resist compositions.

In addition to (i) the monomer or monomers of formulas (2) to (4), (ii) the monomer of formula (8), and (iii) the monomer or monomers of formulae (5) to (7), the polymer of the invention may have copolymerized therewith (iv) another monomer having a carbon-to-carbon double bond other than (i) to (iii). Examples of the additional monomer (iv) include substituted acrylic acid esters such as methyl methacrylate, methyl crotonate, dimethyl maleate, and dimethyl itaconate, unsaturated carboxylic acids such as maleic acid, fumaric acid and itaconic acid, and unsaturated acid anhydrides such as itaconic anhydride.

A variety of copolymerization reaction methods may be used for the preparation of the polymer according to the invention. The preferred polymerization reaction is radical polymerization.

For radical polymerization, preferred reaction conditions include (a) a solvent selected from among hydrocarbons such as benzene, ethers such as tetrahydrofuran, alcohols such as ethanol, and ketones such as methyl isobutyl ketone, (b) a polymerization initiator selected from azo compounds such as 2,2'-azobisisobutyronitrile and peroxides such as benzoyl peroxide and lauroyl peroxide, (c) a temperature of about 0° C. to about 100° C., and (d) a time of about ½ hour to about 48 hours. Reaction conditions outside the described range may be employed if desired.

Resist Composition

Since the polymer of the invention is useful as the base resin of a resist composition, the other aspect of the invention provides a resist composition, especially a chemically amplified positive resist composition, comprising the polymer. Typically, the resist composition contains the polymer, a photoacid generator, and an organic solvent, and other optional components.

Photoacid generator

The photoacid generator is a compound capable of generating an acid upon exposure to high energy radiation or electron beams and includes the following:

(i) onium salts of the formula (P1a-1), (P1a-2) or (P1b),
(ii) diazomethane derivatives of the formula (P2),
(iii) glyoxime derivatives of the formula (P3),
(iv) bissulfone derivatives of the formula (P4),
(v) sulfonic acid esters of N-hydroxyimide compounds of the formula (P5),
(vi) β-ketosulfonic acid derivatives,
(vii) disulfone derivatives,
(viii) nitrobenzylsulfonate derivatives, and
(ix) sulfonate derivatives.

These photoacid generators are described in detail.

(i) Onium Salts of Formula (P1a-1), (P1a-2) or (P1b):

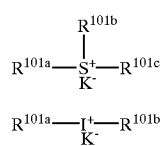

Herein, $R^{101a}$, $R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups. Also, $R^{101b}$ and $R^{101c}$, taken together, may form a ring. $R^{101b}$ and $R^{101c}$ each are alkylene groups of 1 to 6 carbon atoms when they form a ring. $K^-$ is a non-nucleophilic counter ion.

$R^{101a}$, $R^{101b}$, and $R^{101c}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl. Examples of the non-nucleophilic counter ion represented by $K^-$ include halide ions such as chloride and bromide ions, fluoroalkylsulfonate ions such as triflate, 1,1,1-trifluoroethanesulfonate, and nonafluorobutanesulfonate, arylsulfonate ions such as tosylate, benzenesulfonate, 4-fluorobenzenesulfonate, and 1,2,3,4,5-pentafluorobenzenesulfonate, and alkylsulfonate ions such as mesylate and butanesulfonate.

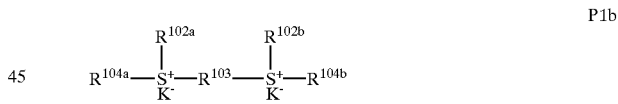

Herein, $R^{102a}$ and $R^{102b}$ independently represent straight, branched or cyclic alkyl groups of 1 to 8 carbon atoms. $R^{103}$ represents a straight, branched or cyclic alkylene groups of 1 to 10 carbon atoms. $R^{104a}$ and $R^{104b}$ independently represent 2-oxoalkyl groups of 3 to 7 carbon atoms. $K^-$ is a non-nucleophilic counter ion.

Illustrative of the groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by $K^-$ are the same as exemplified for formulae (P1a-1) and (P1a-2).

(ii) Diazomethane Derivatives of Formula (P2):

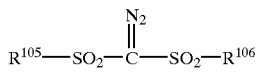
(P2)

Herein, $R^{105}$ and $R^{106}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime Derivatives of Formula (P3):

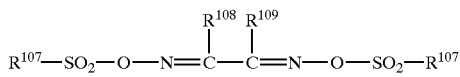
(P3)

Herein, $R^{107}$, $R^{108}$, and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, $R^{108}$ and $R^{109}$, taken together, may form a ring. $R^{108}$ and $R^{109}$ each are straight or branched alkylene groups of 1 to 6 carbon atoms when they form a ring.

Illustrative examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$. Examples of the alkylene groups represented by $R^{108}$ and $R^{109}$ include methylene, ethylene, propylene, butylene, and hexylene.

(iv) Bissulfone Derivatives of Formula (P4):

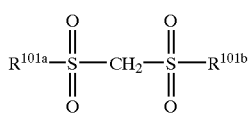
(P4)

Herein, $R^{101a}$ and $R^{101b}$ are as defined above.

(v) Sulfonic Acid Esters of N-hydroxyimide Compounds of Formula (P5):

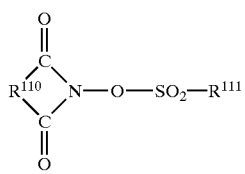
(P5)

Herein, $R^{110}$ is an arylene group of 6 to 10 carbon atoms, alkylene group of 1 to 6 carbon atoms, or alkenylene group of 2 to 6 carbon atoms wherein some or all of the hydrogen atoms may be replaced by straight or branched alkyl or alkoxy groups of 1 to 4 carbon atoms, nitro, acetyl, or phenyl groups. $R^{111}$ is a straight, branched or cyclic alkyl group of 1 to 8 carbon atoms, alkenyl, alkoxyalkyl, phenyl or naphthyl group wherein some or all of the hydrogen atoms may be replaced by alkyl or alkoxy groups of 1 to 4 carbon atoms, phenyl groups (which may have substituted thereon an alkyl or alkoxy of 1 to 4 carbon atoms, nitro, or acetyl group), hetero-aromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, ethylene, trimethylene, tetramethylene, phenylethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the alkyl groups of 1 to 4 carbon atoms include methyl, ethyl, propyl, isopropyl, n-butyl, isobutyl and tert-butyl; the alkoxy groups of 1 to 4 carbon atoms include methoxy, ethoxy, propoxy, isopropoxy, n-butoxy, isobutoxy, and tert-butoxy; the phenyl groups which may have substituted thereon an alkyl or alkoxy of 1 to 4 carbon atoms, nitro, or acetyl group include phenyl, tolyl, p-tert-butoxyphenyl, p-acetylphenyl and p-nitrophenyl; the hetero-aromatic groups of 3 to 5 carbon atoms include pyridyl and furyl.

Illustrative examples of the photoacid generator include: onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)psulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, ethylenebis[methyl(2-oxocyclopentyl)sulfonium trifluoromethanesulfonate], and 1,2'-naphthylcarbonylmethyl-tetrahydrothiophenium triflate;

diazomethane derivatives such as bis(benzenesulfonyl)diazomethane, bis(p-toluenesulfonyl)diazomethane, bis(xylenesulfonyl)diazomethane, bis(cyclohexylsulfonyl)-diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime;

bissulfone derivatives such as bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane, and bisbenzenesulfonylmethane;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and sulfonic acid esters of N-hydroxyimides such as N-hydroxysuccinimide methanesulfonate, N-hydroxysuccinimide trifluoromethanesulfonate, N-hydroxysuccinimide ethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide 1-octanesulfonate, N-hydroxysuccinimide p-toluenesulfonate, N-hydroxysuccinimide p-methoxybenzenesulfonate, N-hydroxysuccinimide 2-chloroethanesulfonate, N-hydroxysuccinimide benzenesulfonate, N-hydroxysuccinimide 2,4,6-trimethylbenzenesulfonate, N-hydroxysuccinimide 1-naphthalenesulfonate, N-hydroxysuccinimide 2-naphthalenesulfonate, N-hydroxy-2-phenylsuccinimide methanesulfonate, N-hydroxymaleimide methanesulfonate, N-hydroxymaleimide ethanesulfonate, N-hydroxy-2-phenylmaleimide methanesulfonate, N-hydroxyglutarimide methanesulfonate, N-hydroxyglutarimide benzenesulfonate, N-hydroxyphthalimide methanesulfonate, N-hydroxyphthalimide benzenesulfonate, N-hydroxyphthalimide trifluoromethanesulfonate, N-hydroxyphthalimide p-toluenesulfonate, N-hydroxynaphthalimide methanesulfonate, N-hydroxynaphthalimide benzenesulfonate, N-hydroxy-5-norbornene-2,3-dicarboxyimide methanesulfonate, N-hydroxy-5-norbornene-2,3-dicarboxyimide trifluoromethanesulfonate, and N-hydroxy-5-norbornene-2,3-dicarboxyimide p-toluenesulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocylohexyl)sulfonium trifluoromethanesulfonate, and 1,2'-naphthylcarbonylmethyltetrahydrothiophenium triflate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane; glyoxime derivatives such as bis-O-(p-toluenesulfonyl)-α-dimethylglyoxime and bis-O-(n-butanesulfonyl)-α-dimethylglyoxime; bissulfone derivatives such as bisnaphthylsulfonylmethane; and sulfonic acid esters of N-hydroxyimide compounds such as N-hydroxysuccinimide methanesulfonate, N-hydroxysuccinimide trifluoromethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide p-toluenesulfonate, N-hydroxynaphthalimide methanesulfonate, and N-hydroxynaphthalimide benzenesulfonate.

These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is added in an amount of 0.1 to 15 parts, and especially 0.5 to 8 parts by weight, per 100 parts by weight of the base resin (all parts are by weight, hereinafter). Less than 0.1 part of the photoacid generator would provide a poor sensitivity whereas more than 15 parts of the photoacid generator would adversely affect transparency and resolution.

Organic Solvent

The organic solvent used herein may be any organic solvent in which the base resin, photoacid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether and 1-ethoxy-2-propanol because the photoacid generator is most soluble therein, propylene glycol monomethyl ether acetate because it is a safe solvent, or a mixture thereof.

An appropriate amount of the organic solvent used is about 200 to 1,000 parts, especially about 400 to 800 parts by weight per 100 parts by weight of the base resin.

Other Polymer

To the resist composition of the invention, another polymer other than the inventive polymer comprising recurring units of formula (1) may also be added. The other polymers that can be added to the resist composition are, for example, those polymers comprising units of the following formula (R1) and/or (R2) and having a weight average molecular weight of about 1,000 to about 500,000, especially about 5,000 to about 100,000 although the other polymers are not limited thereto.

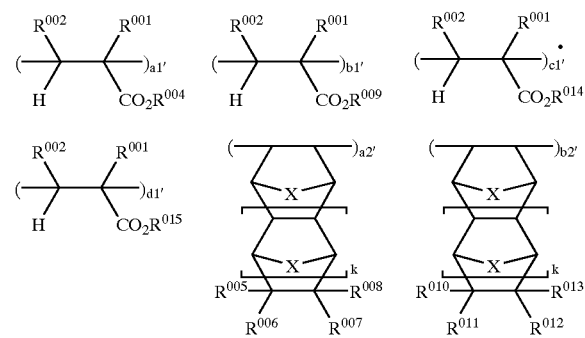

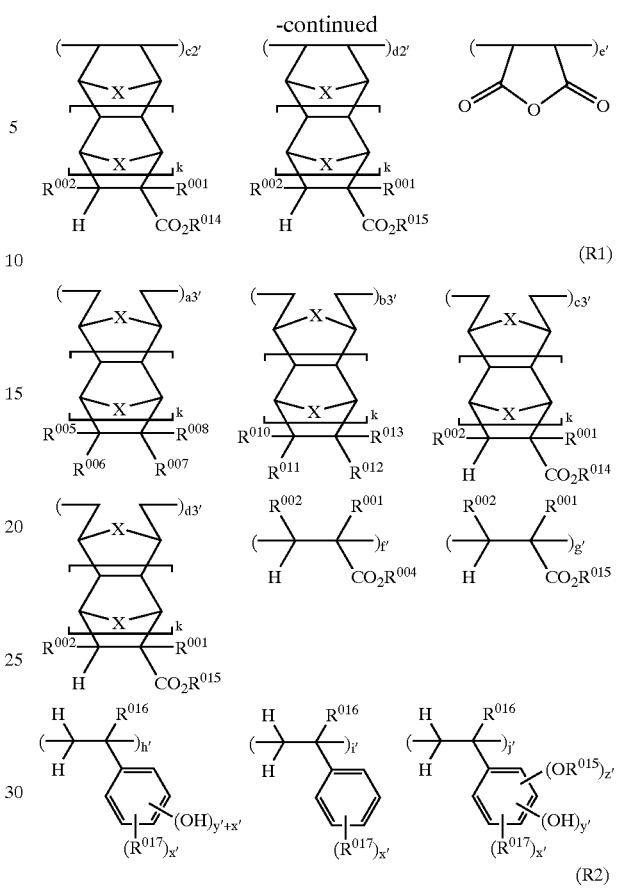

Herein, $R^{001}$ is hydrogen, methyl or $CH_2CO_2R^{003}$. $R^{002}$ is hydrogen, methyl or $CO_2R^{003}$. $R^{003}$ is a straight, branched or cyclic alkyl group of 1 to 15 carbon atoms. $R^{004}$ is hydrogen or a monovalent hydrocarbon group of 1 to 15 carbon atoms having a carboxyl or hydroxyl group. At least one of $R^{005}$ to $R^{008}$ represents a monovalent hydrocarbon group of 1 to 15 carbon atoms having a carboxyl or hydroxyl group while the remaining R's independently represent hydrogen or a straight, branched or cyclic alkyl group of 1 to 15 carbon atoms. Alternatively, $R^{005}$ to $R^{008}$, taken together, may form a ring, and in that event, at least one of $R^{005}$ to $R^{008}$ is a divalent hydrocarbon group of 1 to 15 carbon atoms having a carboxyl or hydroxyl group, while the remaining R's are independently single bonds or straight, branched or cyclic alkylene groups of 1 to 15 carbon atoms. $R^{009}$ is a monovalent hydrocarbon group of 2 to 15 carbon atoms containing at least one partial structure selected from among ether, aldehyde, ketone, ester, carbonate, acid anhydride, amide and imide. At least one of $R^{010}$ to $R^{013}$ is a monovalent hydrocarbon group of 2 to 15 carbon atoms containing at least one partial structure selected from among ether, aldehyde, ketone, ester, carbonate, acid anhydride, amide and imide, while the remaining R's are independently hydrogen or straight, branched or cyclic alkyl groups of 1 to 15 carbon atoms. $R^{010}$ to $R^{013}$, taken together, may form a ring, and in that event, at least one of $R^{010}$ to $R^{013}$ is a divalent hydrocarbon group of 1 to 15 carbon atoms containing at least one partial structure selected from among ether, aldehyde, ketone, ester, carbonate, acid anhydride, amide and imide, while the remaining R's are independently single bonds or straight, branched or cyclic alkylene groups of 1 to 15 carbon atoms.

$R^{014}$ is a polycyclic hydrocarbon group having 7 to 15 carbon atoms or an alkyl group containing a polycyclic hydrocarbon group. $R^{015}$ is an acid labile group. $R^{016}$ is hydrogen or methyl. $R^{017}$ is a straight, branched or cyclic alkyl group of 1 to 8 carbon atoms. X is $CH_2$ or an oxygen atom. Letter k' is equal to 0 or 1; a1', a2', a3', b1', b2', b3', c1', c2', c3', d1', d2', d3', and e' are numbers from 0 to less than 1, satisfying a1'+a2'+a3'+b1'+b2'+b3'+c1'+c2'+c3'+d1'+d2'+d3'+e'=1; f', g', h', i', and j' are numbers from 0 to less than 1, satisfying f'+g'+h'+i'+j'=1; x', y' and z' each are an integer of 0 to 3, satisfying $1 \leq x'+y'+z' \leq 5$ and $1 \leq y'+z' \leq 3$.

Exemplary groups of these R's are as exemplified above.

The inventive polymer (comprising recurring units of formula (1)) and the other polymer are preferably blended in a weight ratio from 100:0 to 10:90, more preferably from 100:0 to 20:80. If the blend ratio of the inventive polymer is below this range, the resist composition would become poor in some of the desired properties. The properties of the resist composition can be adjusted by properly changing the blend ratio of the inventive polymer.

The other polymer is not limited to one type and a mixture of two or more other polymers may be added. The use of plural polymers allows for easy adjustment of resist properties.

Dissolution Regulator

To the resist composition, a dissolution regulator may be added. The dissolution regulator is a compound having on the molecule at least two phenolic hydroxyl groups, in which an average of from 0 to 100 mol % of all the hydrogen atoms on the phenolic hydroxyl groups are replaced with acid labile groups or a compound having on the molecule at least one carboxyl group, in which an average of 50 to 100 mol % of all the hydrogen atoms on the carboxyl groups are replaced with acid labile groups, both the compounds having an average molecular weight within a range of 100 to 1,000, and preferably 150 to 800.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 mol %, and preferably 80 mol %. The degree of substitution of the hydrogen atoms on the carboxyl groups with acid labile groups is on average at least 50 mol %, and preferably at least 70 mol %, of all the carboxyl groups, with the upper limit being 100 mol %.

Preferable examples of such compounds having two or more phenolic hydroxyl groups or compounds having at least one carboxyl group include those of formulas (D1) to (D14) below:

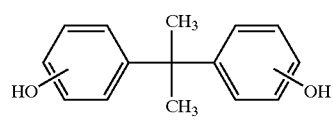

D1

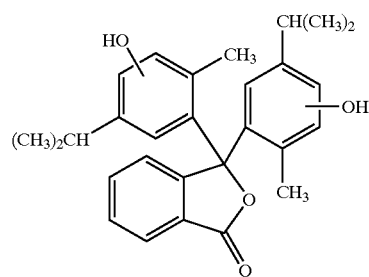

D2

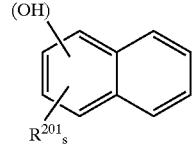

D3

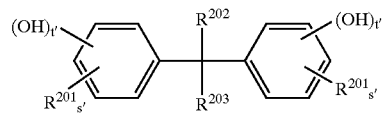

D4

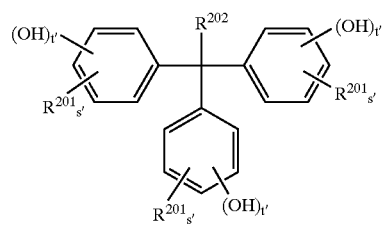

D5

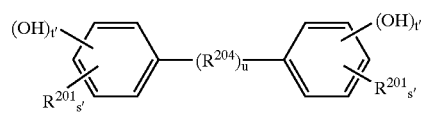

D6

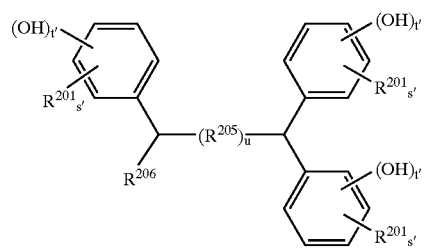

D7

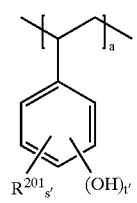

D8

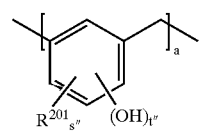

D9

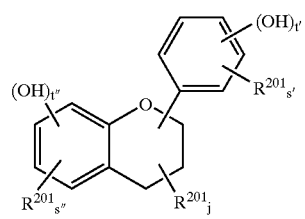

D10

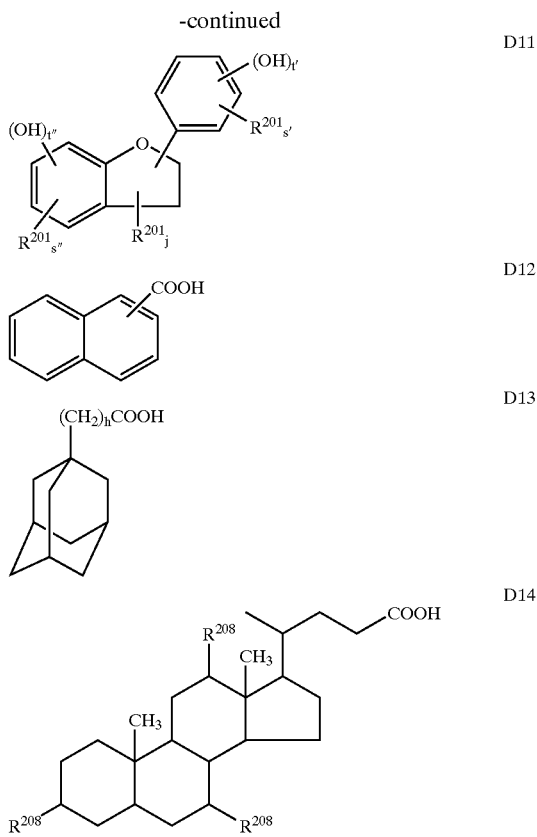

D11

D12

D13

D14

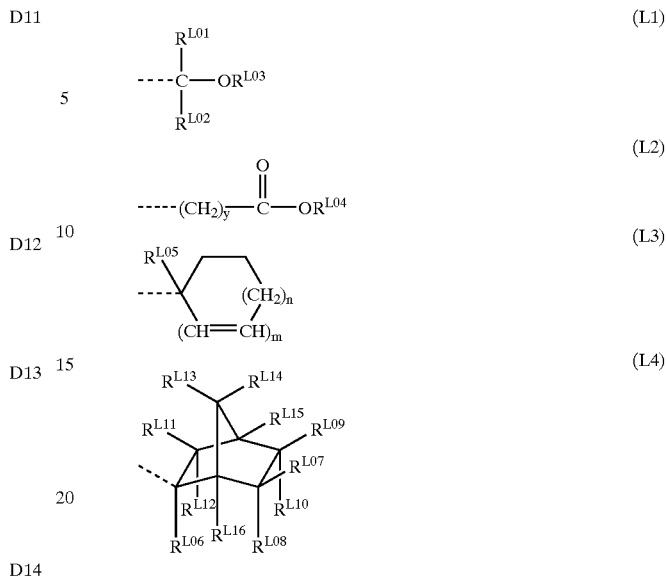

In these formulas, $R^{201}$ and $R^{202}$ are each hydrogen or a straight or branched alkyl or alkenyl of 1 to 8 carbon atoms; $R^{203}$ is hydrogen, a straight or branched alkyl or alkenyl of 1 to 8 carbon atoms, or —$(R^{207})_h$—COOH; $R^{204}$ is —$(CH_2)_i$— (where i=2 to 10), an arylene of 6 to 10 carbon atoms, carbonyl, sulfonyl, an oxygen atom, or a sulfur atom; $R^{205}$ is an alkylene of 1 to 10 carbon atoms, an arylene of 6 to 10 carbon atoms, carbonyl, sulfonyl, an oxygen atom, or a sulfur atom; $R^{206}$ is hydrogen, a straight or branched alkyl or alkenyl of 1 to 8 carbon atoms, or a hydroxyl-substituted phenyl or naphthyl; $R^{207}$ is a straight or branched alkylene of 1 to 10 carbon atoms; $R^{208}$ is hydrogen or hydroxyl; the letter j is an integer from 0 to 5; u and h are each 0 or 1; s, t, s', t', s", and t" are each numbers which satisfy s+t=8, s'+t'=5, and s"+t"=4, and are such that each phenyl skeleton has at least one hydroxyl group; and α is a number such that the compounds of formula (D8) or (D9) have a molecular weight of from 100 to 1,000.

In the above formulas, suitable examples of $R^{201}$ and $R^{202}$ include hydrogen, methyl, ethyl, butyl, propyl, ethynyl, and cyclohexyl; suitable examples of $R^{203}$ include the same groups as for $R^{201}$ and $R^{202}$, as well as —COOH and —$CH_2$COOH; suitable examples of $R^{204}$ include ethylene, phenylene, carbonyl, sulfonyl, oxygen, and sulfur; suitable examples of $R^{205}$ include methylene as well as the same groups as for $R^{204}$; and suitable examples of $R^{206}$ include hydrogen, methyl, ethyl, butyl, propyl, ethynyl, cyclohexyl, and hydroxyl-substituted phenyl or naphthyl.

Exemplary acid labile groups on the dissolution regulator include groups of the following general formulae (L1) to (L4), tertiary alkyl groups of 4 to 20 carbon atoms, trialkyl-silyl groups in which each of the alkyls has 1 to 6 carbon atoms, and oxoalkyl groups of 4 to 20 carbon atoms.

In these formulas, $R^{L01}$ and $R^{L02}$ are each hydrogen or a straight, branched or cyclic alkyl having 1 to 18 carbon atoms; and $R^{L03}$ is a monovalent hydrocarbon group of 1 to 18 carbon atoms which may contain a heteroatom (e.g., oxygen). A pair of $R^{L01}$ and $R^{L02}$, a pair of $R^{L01}$ and $R^{L03}$, or a pair of $R^{L02}$ and $R^{L03}$ may together form a ring, with the proviso that $R^{L01}$, $R^{L02}$, and $R^{L03}$ are each a straight or branched alkylene of 1 to 18 carbon atoms when they form a ring. $R^{L04}$ is a tertiary alkyl group of 4 to 20 carbon atoms, a trialkysilyl group in which each of the alkyls has 1 to 6 carbon atoms, an oxoalkyl group of 4 to 20 carbon atoms, or a group of the formula (L1). $R^{L05}$ is a monovalent hydrocarbon groups of 1 to 8 carbon atoms which may contain a hetero atom or a substituted or unsubstituted aryl group of 6 to 20 carbon atoms. $R^{L06}$ is a monovalent hydrocarbon group of 1 to 8 carbon atoms which may contain a hetero atom or a substituted or unsubstituted aryl group of 6 to 20 carbon atoms. $R^{L07}$ to $R^{L16}$ independently represent hydrogen or monovalent hydrocarbon groups of 1 to 15 carbon atoms which may contain a hetero atom. Alternatively, $R^{L07}$ to $R^{L16}$, taken together, may form a ring. Each of $R^{L07}$ to $R^{L16}$ represents a divalent $C_1$–$C_{15}$ hydrocarbon group which may contain a hetero atom, when they form a ring. Two of $R^{L07}$ to $R^{L16}$ which are attached to adjoining carbon atoms may bond together directly to form a double bond. Letter y is an integer of 0 to 6. Letter m is equal to 0 or 1, n is equal to 0, 1, 2 or 3, and 2m+n is equal to 2 or 3. Illustrative examples of these groups are as previously exemplified.

The dissolution regulator may be formulated in an amount of 0 to 50 parts, preferably 0 to 40 parts, and more preferably 0 to 30 parts, per 100 parts of the base resin, and may be used singly or as a mixture of two or more thereof. The use of more than 50 parts would lead to slimming of the patterned film, and thus a decline in resolution.

The dissolution regulator can be synthesized by introducing acid labile groups into a compound having phenolic hydroxyl or carboxyl groups in accordance with an organic chemical formulation.

Basic Compound

In the resist composition of the invention, a basic compound may be blended. A suitable basic compound used herein is a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile.

Examples of basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)-pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (B1) may also be included alone or in admixture.

$$N(X)_n(Y)_{3-n} \quad (B1)$$

In the formula, n is equal to 1, 2 or 3; Y is independently hydrogen or a straight, branched or cyclic alkyl group of 1 to 20 carbon atoms which may contain a hydroxyl group or ether; and X is independently selected from groups of the following general formulas (X1) to (X3), and two or three X's may bond together to form a ring:

$$\text{—}R^{300}\text{—}O\text{—}R^{301} \quad (X1)$$

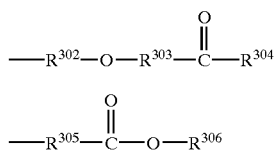

(X2)

(X3)

In the formulas, $R^{300}$, $R^{302}$ and $R^{305}$ are independently straight or branched alkylene groups of 1 to 4 carbon atoms; $R^{301}$ and $R^{304}$ are independently hydrogen, straight, branched or cyclic alkyl groups of 1 to 20 carbon atoms, which may contain at least one hydroxyl group, ether, ester or lactone ring; $R^{303}$ is a single bond or a straight or branched alkylene group of 1 to 4 carbon atoms; and $R^{306}$ is a single bond or a straight, branched or cyclic alkyl group of 1 to 20 carbon atoms which may contain one or more hydroxyl groups, ether groups, ester groups or lactone rings.

Illustrative examples of the compounds of formula (B1) include tris(2-methoxymethoxyethyl)amine, tris{2-(methoxyethoxy)ethyl}amine, tris{2-(2-methoxyethoxymethoxy)ethyl}-amine, tris{2-(1-methoxyethoxy)ethyl}amine, tris{2-(1-ethoxyethoxy)ethyl}amine, tris{2-(1-ethoxypropoxy)ethyl}-amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)-amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)-bis[2-(methoxycarbonyl)-ethyl]amine, N-(2-acetoxyethyl)-bis[2-(methoxycarbonyl)-ethyl]amine, N-(2-hydroxyethyl)-bis[2-(ethoxycarbonyl)-ethyl]amine, N-(2-acetoxyethyl)-bis[2-(ethoxycarbonyl)-ethyl]amine, N-(3-hydroxy-1-propyl)-bis[2-(methoxycarbonyl)-ethyl]amine, N-(3-acetoxy-1-propyl)-bis[2-(methoxycarbonyl)-ethyl]amine, N-(2-methoxyethyl)-bis[2-(methoxycarbonyl)-ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Also useful are one or more of cyclic structure-bearing basic compounds having the following general formula (B2):

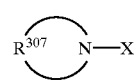

(B2)

Herein X is as defined above, and $R^{307}$ is a straight or branched alkylene group of 2 to 20 carbon atoms which may contain one or more carbonyl groups, ether structures, ester structures or sulfide structures.

Illustrative examples of the cyclic structure-bearing basic compounds having formula (B2) include 1-[2-(methoxymethoxy)ethyl]pyrrolidine, 1-[2-(methoxymethoxy)ethyl]piperidine, 4-[2-(methoxymethoxy)ethyl]-morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]-piperidine, 4-[2-(2-methoxyethoxycarbonyloxy)ethyl]-morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl) methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, and 2-methoxyethyl morpholinoacetate.

Also, one or more of cyano-bearing basic compounds having the following general formulae (B3) to (B6) may be blended:

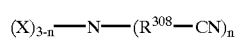  (B3)

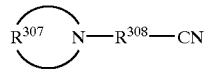  (B4)

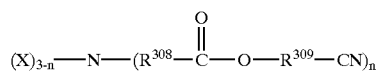  (B5)

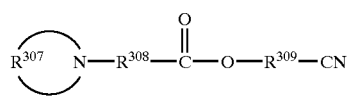  (B6)

Herein, X, $R^{307}$ and n are as defined above, and $R^{308}$ and $R^{309}$ each are independently a straight or branched alkylene group of 1 to 4 carbon atoms.

Illustrative examples of the cyano-bearing basic compounds having formulae (B3) to (B6) include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

The basic compound is preferably formulated in an amount of 0.001 to 10 parts, and especially 0.01 to 1 part, per part of the photoacid generator. Less than 0.001 part of the basic compound may fail to achieve the desired effects thereof, while the use of more than 10 parts would result in too low a sensitivity and resolution.

Other Components

In the resist composition, a compound bearing a ≡C—COOH group in a molecule may be blended. Exemplary, non-limiting compounds bearing a ≡C—COOH group include one or more compounds selected from Groups I and II below. Including this compound improves the PED stability of the resist and ameliorates edge roughness on nitride film substrates.

Group I:

Compounds in which some or all of the hydrogen atoms on the phenolic hydroxyl groups of the compounds of general formulas (A1) to (A10) below have been replaced with —$R^{401}$—COOH (wherein $R^{401}$ is a straight or branched alkylene of 1 to 10 carbon atoms), and in which the molar ratio C/(C+D) of phenolic hydroxyl groups (C) to ≡C—COOH groups (D) in the molecule is from 0.1 to 1.0.

  (A1)

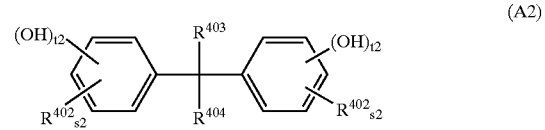  (A2)

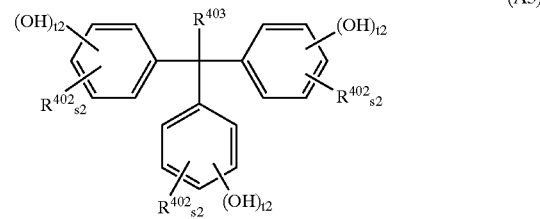  (A3)

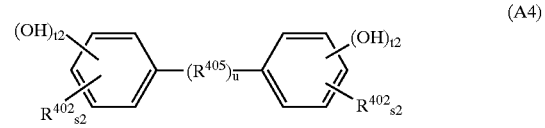  (A4)

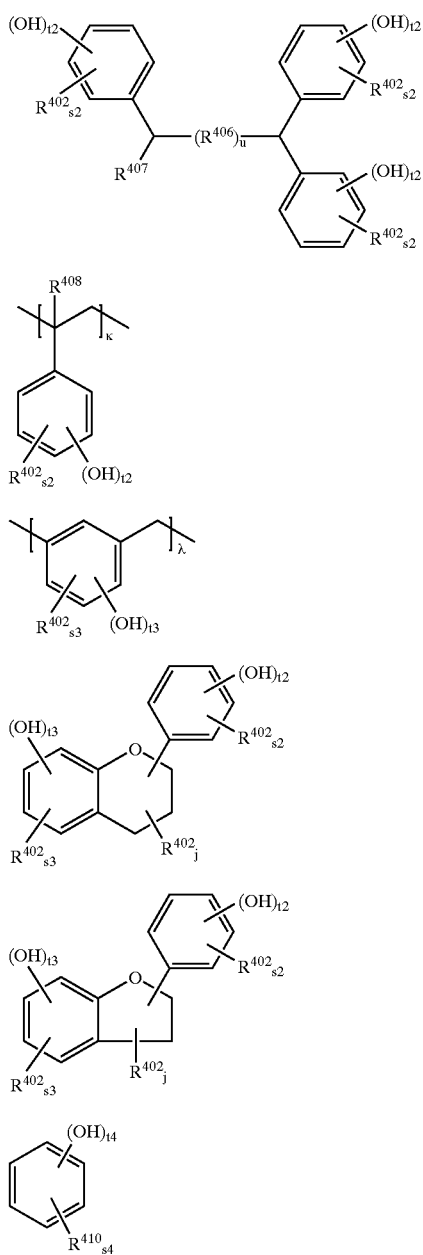

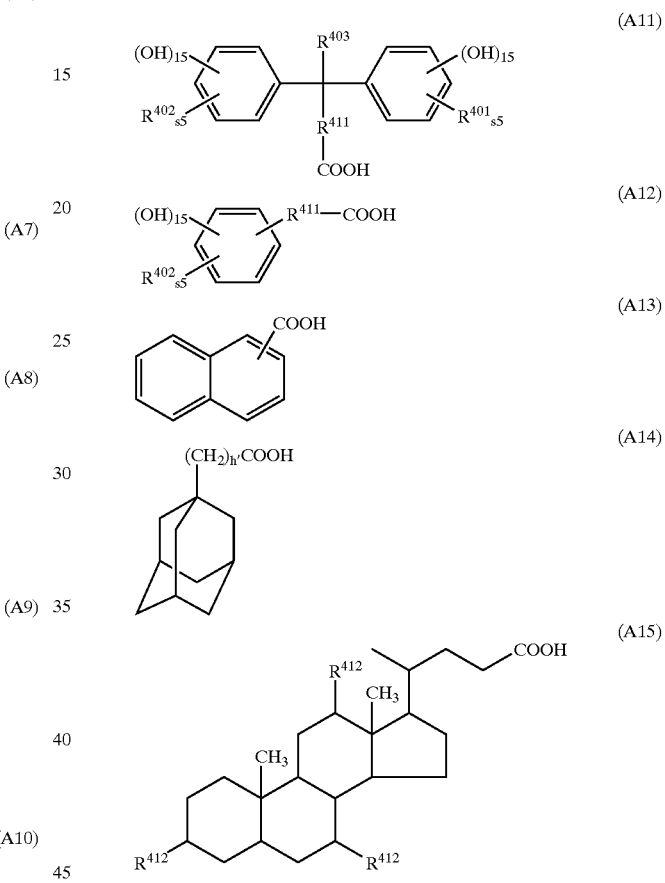

0 or 1; s1, t1, s2, t2, s3, t3, s4, and t4 are each numbers which satisfy s1+t1=8, s2+t2=5, s3+t3=4, and s4+t4=6, and are such that each phenyl skeleton has at least one hydroxyl group; κ is a number such that the compound of formula (A6) may have a weight average molecular weight of 1,000 to 5,000; and λ is a number such that the compound of formula (A7) may have a weight average molecular weight of 1,000 to 10,000.

Group II:

Compounds of general formulas (A11) to (A15) below:

In these formulas, $R^{408}$ is hydrogen or methyl; $R^{402}$ and $R^{403}$ are each hydrogen or a straight or branched alkyl or alkenyl of 1 to 8 carbon atoms; $R^{404}$ is hydrogen, a straight or branched alkyl or alkenyl of 1 to 8 carbon atoms, or a —$(R^{409})_h$—COOR' group (R' being hydrogen or —$R^{409}$—COOH); $R^{405}$ is —$(CH_2)_i$— (wherein i is 2 to 10), an arylene of 6 to 10 carbon atoms, carbonyl, sulfonyl, an oxygen atom, or a sulfur atom; $R^{406}$ is an alkylene of 1 to 10 carbon atoms, an arylene of 6 to 10 carbon atoms, carbonyl, sulfonyl, an oxygen atom, or a sulfur atom; $R^{407}$ is hydrogen, a straight or branched alkyl or alkenyl of 1 to 8 carbon atoms, or a hydroxyl-substituted phenyl or naphthyl; $R^{409}$ is a straight or branched alkylene of 1 to 10 carbon atoms; $R^{410}$ is hydrogen, a straight or branched alkyl or alkenyl of 1 to 8 carbon atoms, or a —$R^{411}$—COOH group; $R^{411}$ is a straight or branched alkylene of 1 to 10 carbon atoms; the letter j is an integer from 0 to 5; u and h are each In these formulas, $R^{402}$, $R^{403}$, and $R^{411}$ are as defined above; $R^{412}$ is hydrogen or hydroxyl; s5 and t5 are numbers which satisfy s5≧0, t5≧0, and s5+t5=5; and h' is equal to 0 or 1.

Illustrative, non-limiting examples of the compound bearing a ≡C—COOH group include compounds of the general formulas AI-1 to AI-14 and AII-1 to AII-10 below:

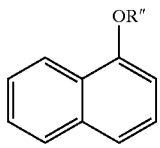

AI-1

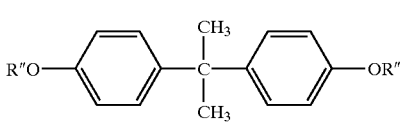

AI-2

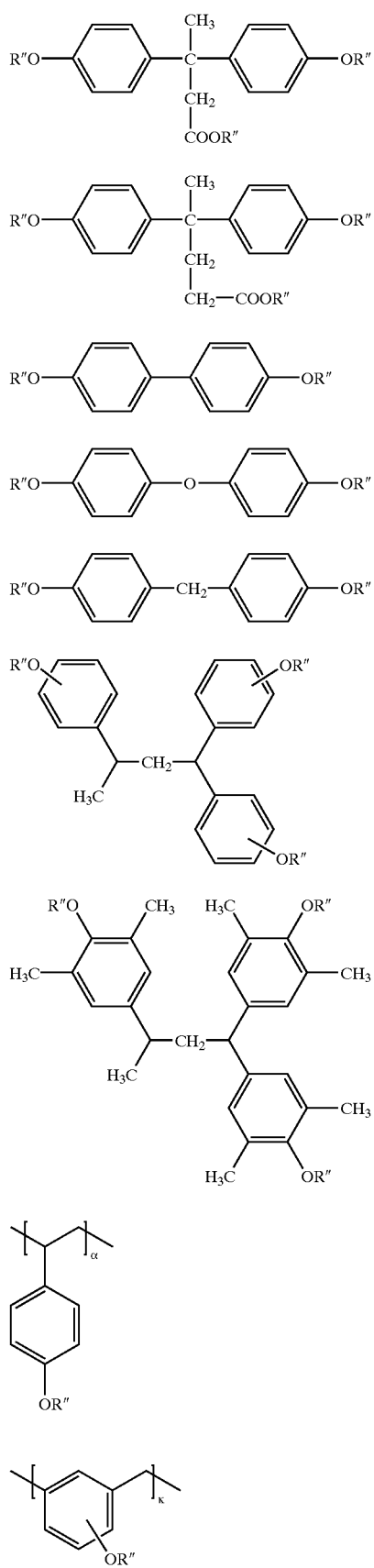
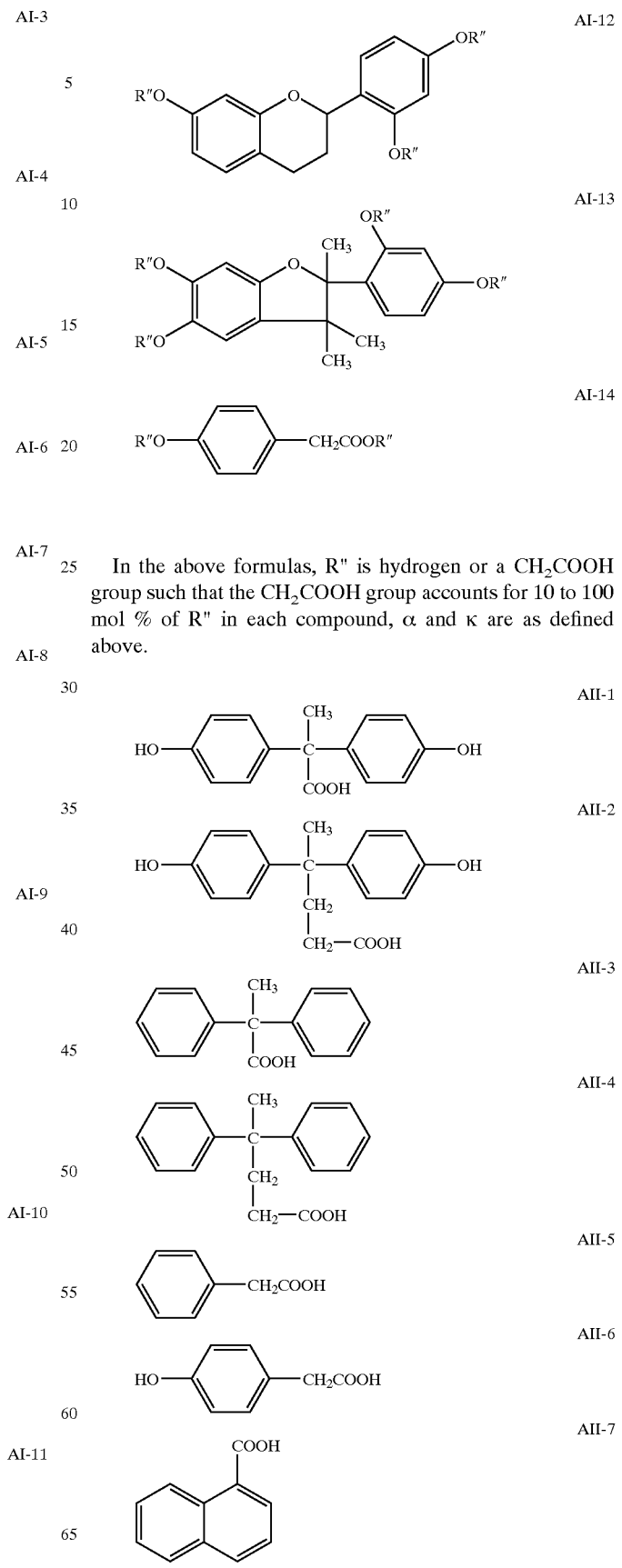
In the above formulas, R″ is hydrogen or a CH$_2$COOH group such that the CH$_2$COOH group accounts for 10 to 100 mol % of R″ in each compound, α and κ are as defined above.

-continued

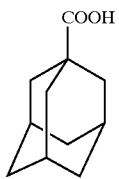
AII-8

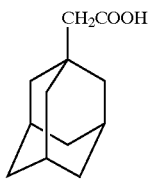
AII-9

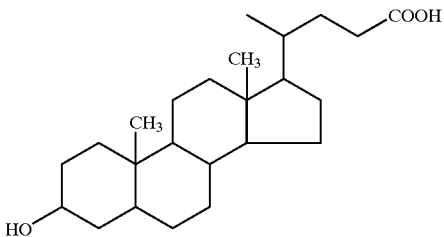
AII-10

The compound bearing a ≡C—COOH group within the molecule may be used singly or as combinations of two or more thereof.

The compound bearing a ≡C—COOH group within the molecule is added in an amount ranging from 0 to 5 parts, preferably 0.1 to 5 parts, more preferably 0.1 to 3 parts, further preferably 0.1 to 2 parts, per 100 parts of the base resin. More than 5 parts of the compound can reduce the resolution of the resist composition.

The resist composition of the invention may additionally include an acetylene alcohol derivative for the purpose of enhancing the shelf stability. Preferred acetylene alcohol derivatives are those having the general formula (S1) or (S2) below:

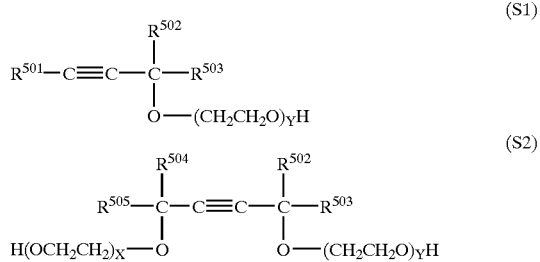

In the formulas, $R^{501}$, $R^{502}$, $R^{503}$, $R^{504}$, and $R^{505}$ are each hydrogen or a straight, branched, or cyclic alkyl of 1 to 8 carbon atoms; and X and Y are each 0 or a positive number, satisfying $0 \leq X \leq 30$, $0 \leq Y \leq 30$, and $0 \leq X+Y \leq 40$.

Preferable examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc., and Surfynol E1004 from Nisshin Chemical Industry K.K.

The acetylene alcohol derivative is preferably added in an amount of 0.01 to 2% by weight, and more preferably 0.02 to 1% by weight, per 100% by weight of the resist composition. Less than 0.01% by weight would be ineffective for improving coating characteristics and shelf stability, whereas more than 2% by weight would result in a resist having a low resolution.

The resist composition of the invention may include optional ingredients, for example, a surfactant which is commonly used for improving the coating characteristics. Optional ingredients may be added in conventional amounts so long as this does not compromise the objects of the invention.

Nonionic surfactants are preferred, examples of which include perfluoroalkylpolyoxyethylene ethanols, fluorinated alkyl esters, perfluoroalkylamine oxides, perfluoroalkyl EO-addition products, and fluorinated organosiloxane compounds. Useful surfactants are commercially available under the trade names Florade FC-430 and FC-431 from Sumitomo 3M, Ltd., Surflon S-141 and S-145, KH-10, KH-20, KH-30 and KH-40 from Asahi Glass Co., Ltd., Unidyne DS-401, DS-403 and DS-451 from Daikin Industry Co., Ltd., Megaface F-8151 from Dai-Nippon Ink & Chemicals, Inc., and X-70-092 and X-70-093 from Shin-Etsu Chemical Co., Ltd. Preferred surfactants are Florade FC-430 from Sumitomo 3M, Ltd., KH-20 and KH-30 from Asahi Glass Co., Ltd., and X-70-093 from Shin-Etsu Chemical Co., Ltd.

Pattern formation using the resist composition of the invention may be carried out by a known lithographic technique. For example, the resist composition is applied onto a substrate such as a silicon wafer by spin coating or the like to form a resist film having a thickness of 0.2 to 2.0 μm, which is then pre-baked on a hot plate at 60 to 150° C. for 1 to 10 minutes, and preferably at 80 to 130° C. for 1 to 5 minutes. A patterning mask having the desired pattern is then placed over the resist film, and the film exposed through the mask to an electron beam or to high-energy radiation such as deep-UV rays, an excimer laser, or x-rays in a dose of about 1 to 200 mJ/cm², and preferably about 5 to 100 mJ/cm², then post-exposure baked (PEB) on a hot plate at 60 to 150° C. for 1 to 5 minutes, and preferably at 80 to 130° C. for 1 to 3 minutes. Finally, development is carried out using as the developer an aqueous alkali solution, such as a 0.1 to 5% (preferably 2 to 3%) aqueous solution of tetramethylammonium hydroxide (TMAH), this being done by a conventional method such as dipping, puddling, or spraying for a period of 0.1 to 3 minutes, and preferably 0.5 to 2 minutes. These steps result in the formation of the desired pattern on the substrate. Of the various types of high-energy radiation that may be used, the resist composition of the invention is best suited to fine pattern formation with, in particular, deep-UV rays having a wavelength of 248 to 193 nm, an excimer laser, x-rays, or an electron beam. The desired pattern may not be obtainable outside the upper and lower limits of the above range.

The resist composition comprising the inventive polymer as a base resin lends itself to micropatterning with electron beams or deep-UV rays since it is sensitive to high-energy radiation and has excellent sensitivity, resolution, and etching resistance. Especially because of the minimized absorption at the exposure wavelength of an ArF or KrF excimer laser, a finely defined pattern having sidewalls perpendicular to the substrate can easily be formed.

EXAMPLE

Synthesis Examples and Examples are given below by way of illustration and not by way of limitation. The abbreviation Mw is a weight average molecular weight as measured by GPC using a polystyrene standard, and SEM is scanning electron microscope.

Polymers within the scope of the invention were synthesized by the following procedure.

Synthesis Example 1

Synthesis of Polymer 1

A mixture of 16.00 g (160 mmol) of isobutyl vinyl ether, 14.88 g (60 mmol) of 2-ethyl-2-adamantyl methacrylate, and 3.43 g of 1,4-dioxane was heated at 60° C. To the solution was added 0.74 g (3 mmol) of 2,2'-azobis(2,4-dimethylvaleronitrile). The solution was stirred for 15 hours while keeping at 60° C. The reaction solution was cooled to room temperature and dissolved in 50 ml of acetone, which with vigorous stirring, was added dropwise to 1000 ml of isopropyl alcohol. The resulting solids were collected by filtration and dried in vacuum at 40° C. for 15 hours, obtaining 11.28 g of a white powder. On $^1$H-NMR analysis, it was confirmed to be a polymer designated Polymer 1 whose structure is shown below.

Synthesis Examples 2–12

Synthesis of Polymers 2–12

Polymers 2 to 12 were synthesized by the same procedure as above or a well-known procedure.

Synthesis Example 13

Synthesis of Polymer 13

A mixture of 22.40 g (160 mmol) of 5-methoxymethyl-7-oxabicyclo[2.2.1]hept-2-ene, 14.88 g (60 mmol) of 2-ethyl-2-adamantyl methacrylate, and 5.33 g of 1,4-dioxane was heated at 60° C. To the solution was added 0.74 g (3 mmol) of 2,2'-azobis(2,4-dimethylvaleronitrile). The solution was stirred for 15 hours while keeping at 60° C. The reaction solution was cooled to room temperature and dissolved in 50 ml of acetone, which with vigorous stirring, was added dropwise to 1000 ml of isopropyl alcohol. The resulting solids were collected by filtration and dried in vacuum at 40° C. for 15 hours, obtaining 11.26 g of a white powder. On $^1$H-NMR analysis, it was confirmed to be a polymer designated Polymer 13 whose structure is shown below.

Synthesis Examples 14–20

Synthesis of Polymers 14–20

Polymers 14 to 20 were synthesized by the same procedure as above or a well-known procedure.

Synthesis Example 21

Synthesis of Polymer 21

A mixture of 20.80 g (160 mmol) of acrolein diethyl acetal, 14.88 g (60 mmol) of 2-ethyl-2-adamantyl methacrylate, and 3.57 g of 1,4-dioxane was heated at 60° C. To the solution was added 0.74 g (3 mmol) of 2,2'-azobis (2,4-dimethylvaleronitrile). The solution was stirred for 15 hours while keeping at 60° C. The reaction solution was cooled to room temperature and dissolved in 50 ml of acetone, which with vigorous stirring, was added dropwise to 1000 ml of isopropyl alcohol. The resulting solids were collected by filtration and dried in vacuum at 40° C. for 15 hours, obtaining 10.08 g of a white powder. On $^1$H-NMR analysis, it was confirmed to be a polymer designated Polymer 21 whose structure is shown below.

Synthesis Examples 22–28

Synthesis of Polymers 22–28

Polymers 22 to 28 were synthesized by the same procedure as above or a well-known procedure.

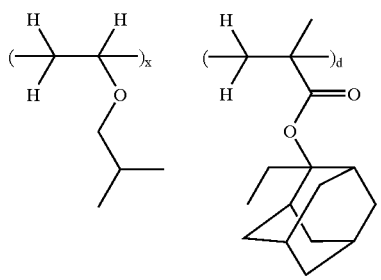

(x = 0.40, d = 0.60, Mw = 6,800) (Polymer 1)

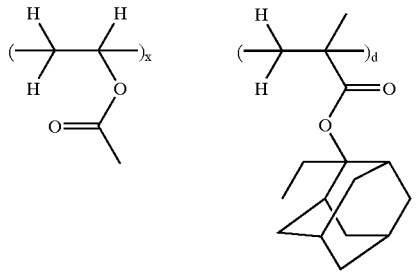

(x = 0.40, d = 0.60, Mw = 7,300) (Polymer 2)

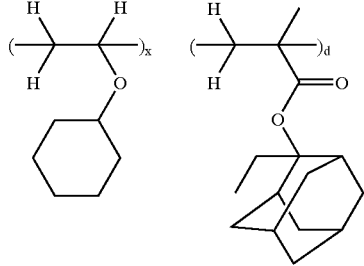

(x = 0.40, d = 0.60, Mw = 8,000) (Polymer 3)

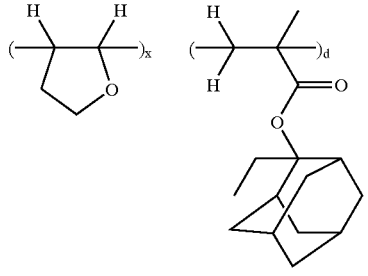

(x = 0.40, d = 0.60, Mw = 6,100) (Polymer 4)

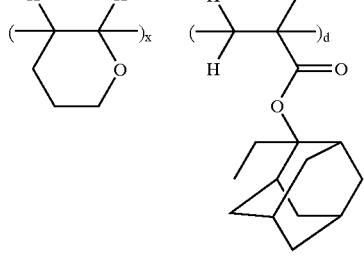

(x = 0.40, d = 0.60, Mw = 6,800) (Polymer 5)

(Polymer 6)
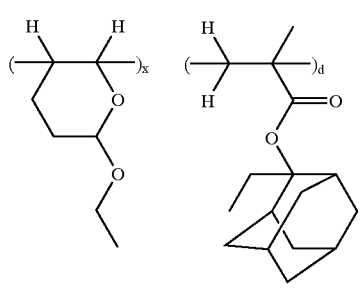
(x = 0.40, d = 0.60, Mw = 7,300)
(Polymer 7)
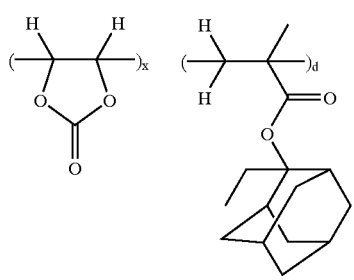
(x = 0.40, d = 0.60, Mw = 8,000)
(Polymer 8)
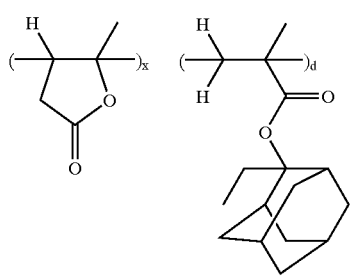
(x = 0.40, d = 0.60, Mw = 6,100)
(Polymer 9)
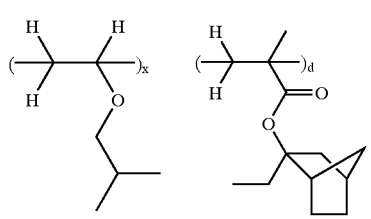
(x = 0.40, d = 0.60, Mw = 7,400)
(Polymer 10)
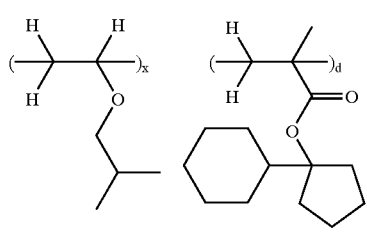
(x = 0.40, d = 0.60, Mw = 7,100)
(Polymer 11)
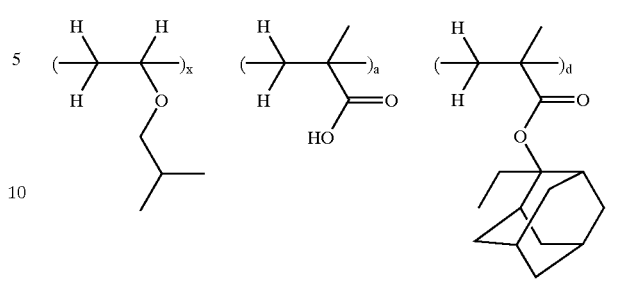
(x = 0.40, a = 0.10, d = 0.50, Mw = 8,600)
(Polymer 12)
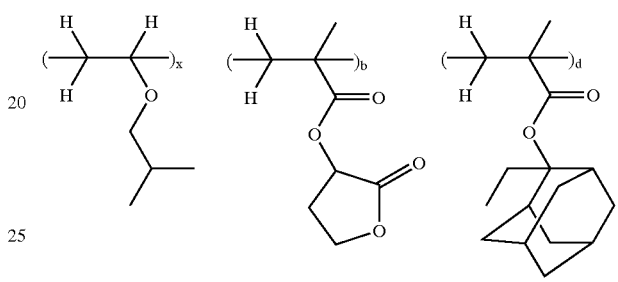
(x = 0.30, b = 0.20, d = 0.50, Mw = 8,200)
(Polymer 13)
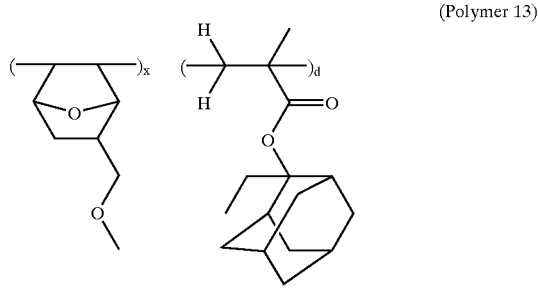
(x = 0.40, d = 0.60, Mw = 7,700)
(Polymer 14)
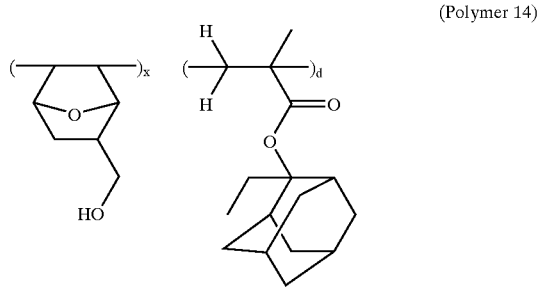
(x = 0.40, d = 0.60, Mw = 8,100)
(Polymer 15)
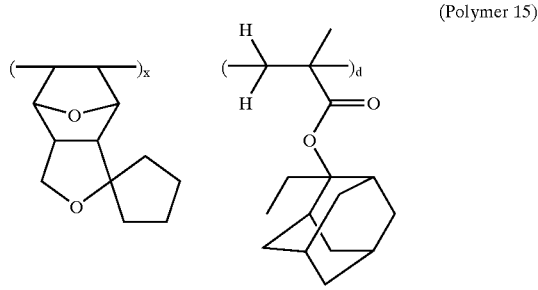
(x = 0.40, d = 0.60, Mw = 7,200)

(Polymer 16)
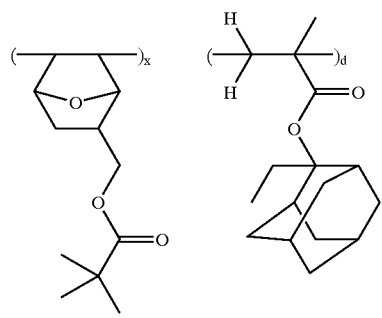
(x = 0.40, d = 0.60, Mw = 7,500)
(Polymer 17)
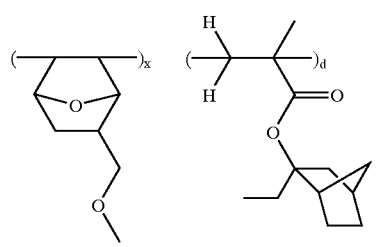
(x = 0.40, d = 0.60, Mw = 8,800)
(Polymer 18)
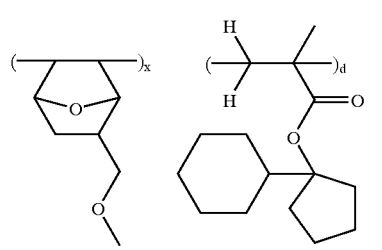
(x = 0.40, d = 0.60, Mw = 8,500)
(Polymer 19)
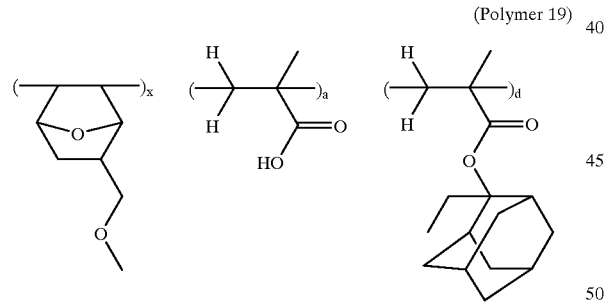
(x = 0.40, a = 0.10, d = 0.50, Mw = 8,600)
(Polymer 20)
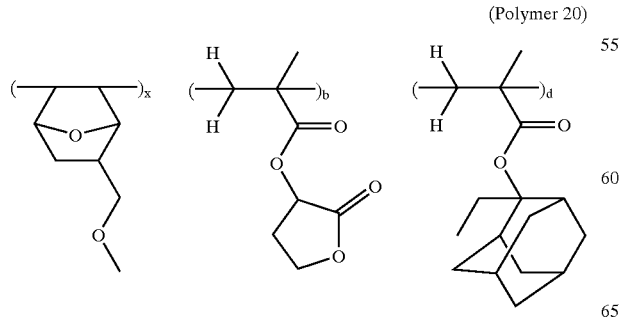
(x = 0.30, b = 0.20, d = 0.50, Mw = 8,300)
(Polymer 21)
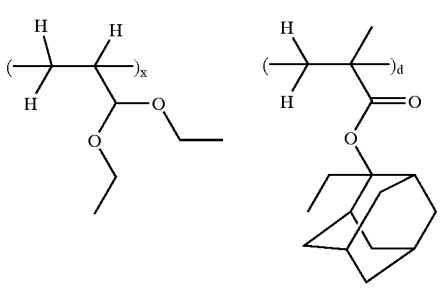
(x = 0.40, d = 0.60, Mw = 6,800)
(Polymer 22)
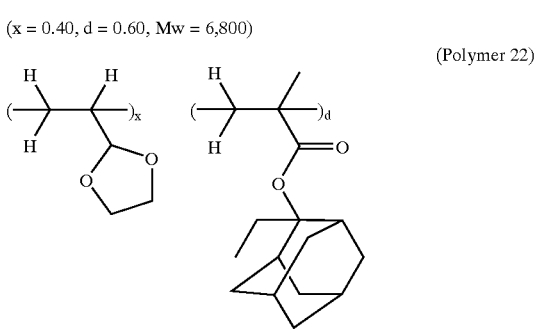
(x = 0.40, d = 0.60, Mw = 7,300)
(Polymer 23)
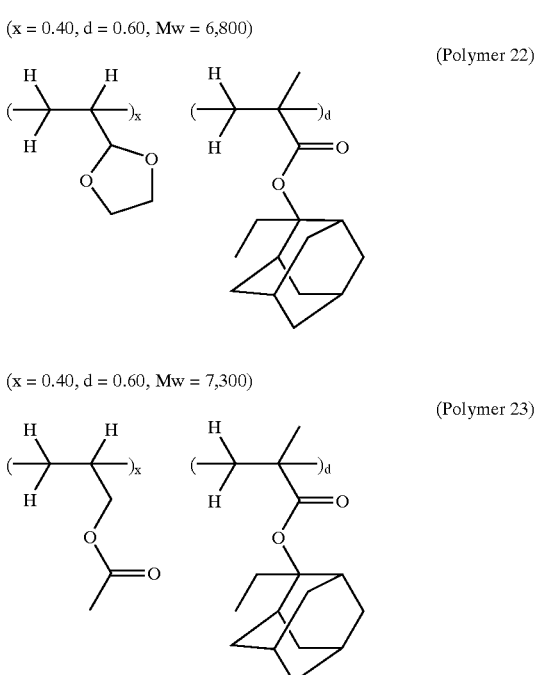
(x = 0.40, d = 0.60, Mw = 8,000)
(Polymer 24)
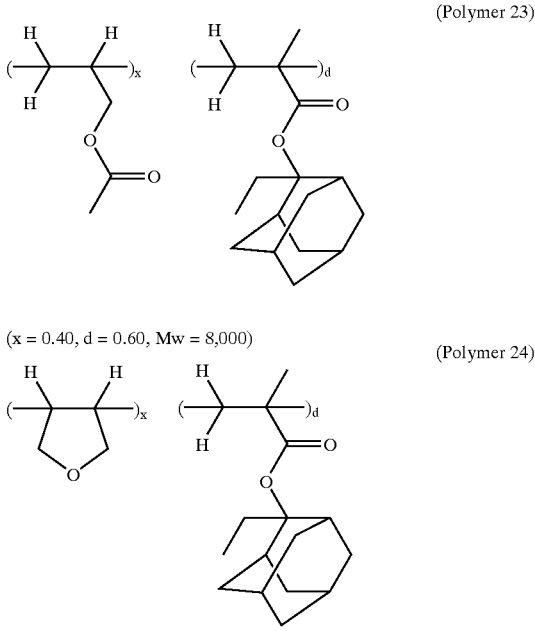
(x = 0.40, d = 0.60, Mw = 6,100)
(Polymer 25)
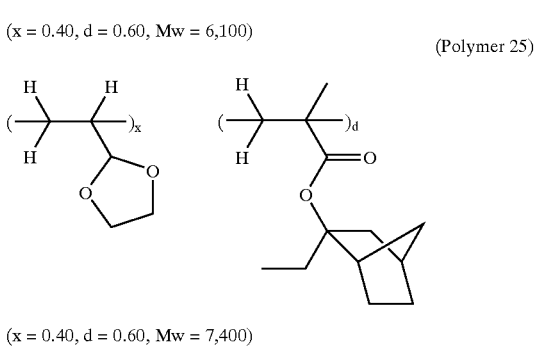
(x = 0.40, d = 0.60, Mw = 7,400)

-continued

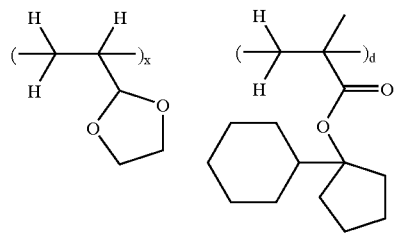
(Polymer 26)

(x = 0.40, d = 0.60, Mw = 7,100)

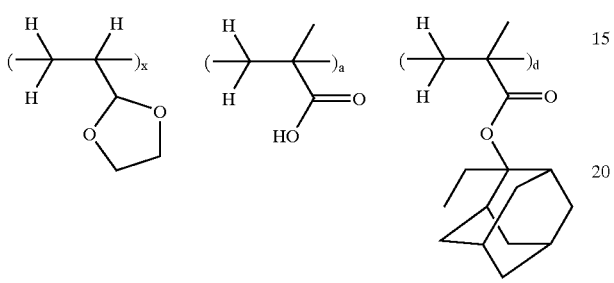
(Polymer 27)

(x = 0.40, a = 0.10, d = 0.50, Mw = 8,600)

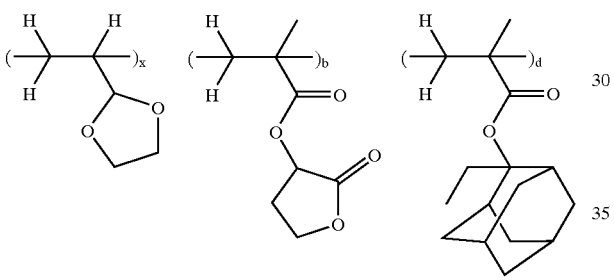
(Polymer 28)

(x = 0.30, b = 0.20, d = 0.50, Mw = 8,200)

Resist compositions were formulated using inventive polymers and examined for resolution upon ArF excimer laser exposure.

Examples 1 to 55

Evaluation of resist resolution

Resist compositions were prepared by using Polymers 1 to 28 as the base resin, and dissolving the polymer, a photoacid generator (designated as PAG1 and 2), a dissolution regulator (designated as DRR1 to 4), a basic compound, and a compound having a ≡C—COOH group in the molecule (ACC1 and 2) in a solvent in accordance with the formulation shown in Tables 1 to 3. These compositions were each filtered through a Teflon filter (pore diameter 0.2 μm), thereby giving resist solutions.

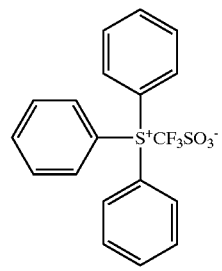
(PAG 1)

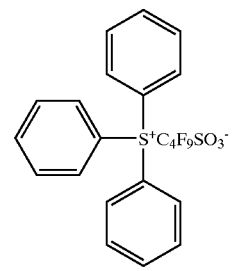
(PAG 2)

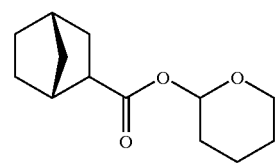
(DRR 1)

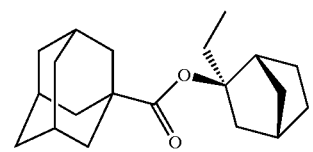
(DRR 2)

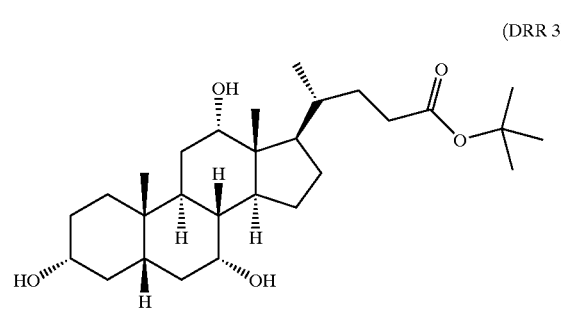
(DRR 3)

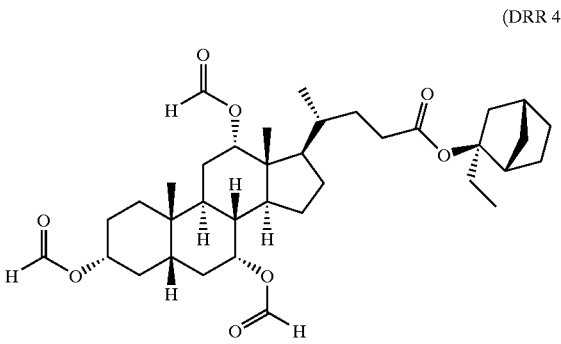
(DRR 4)

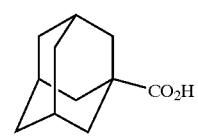
(ACC 1)

-continued

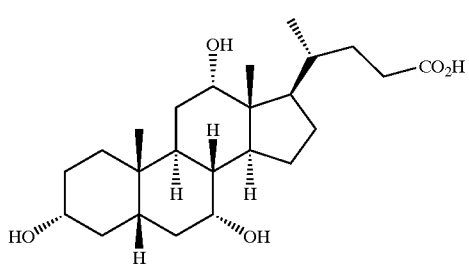
(ACC 2)

The solvent and basic compounds used are as follows. It is noted that the solvent contained 0.01% by weight of surfactant KH-20 (Asahi Glass Co., Ltd.).
PGMEA: propylene glycol methyl ether acetate
TEA: triethanolamine
TMMEA: trismethoxymethoxyethylamine
TMEMEA: trismethoxyethoxymethoxyethylamine These resist solutions were spin coated onto silicon wafers having an antireflection film (ARC25 by Nissan Chemical Co., Ltd., 77 nm thick) coated thereon, then heat treated at 130° C. for 90 seconds to give resist films having a thickness of 375 nm. The resist films were exposed using an ArF excimer laser stepper (Nikon Corporation; NA 0.55), then heat treated at 110° C. for 90 seconds, and puddle developed with a solution of 2.38% tetramethylammonium hydroxide in water for 60 seconds, thereby giving 1:1 line-and-space patterns.

The wafers as developed were sectioned and observed under sectional SEM. The optimal dose (Eop, mJ/cm$^2$) was defined as the dose which provided a 1:1 resolution at the top and bottom of a 0.20 μm line-and-space pattern. The resolution of the resist under evaluation was defined as the minimum line width (μm) of the lines and spaces that separated at the optimal dose. The shape of the resolved resist pattern was examined under a SEM and classified into rectangular, rounded head, T-top, forward taper or reverse taper.

The composition and test results of the resist materials are shown in Tables 1 to 3.

TABLE 1

| Example | Resin (pbw) | Photoacid generator (pbw) | Dissolution regulator (pbw) | Basic compound (pbw) | Solvent (pbw) | Eop, mJ/cm$^2$ | Resolution, μm | Shape |
|---|---|---|---|---|---|---|---|---|
| 1 | Polymer 1 (80) | PAG 1 (1) | — | TEA (0.125) | PGMEA (480) | 36.0 | 0.16 | rectangular |
| 2 | Polymer 2 (80) | PAG 1 (1) | — | TEA (0.125) | PGMEA (480) | 38.0 | 0.16 | rectangular |
| 3 | Polymer 3 (80) | PAG 1 (1) | — | TEA (0.125) | PGMEA (480) | 34.0 | 0.16 | rectangular |
| 4 | Polymer 4 (80) | PAG 1 (1) | — | TEA (0.125) | PGMEA (480) | 36.0 | 0.16 | rectangular |
| 5 | Polymer 5 (80) | PAG 1 (1) | — | TEA (0.125) | PGMEA (480) | 36.0 | 0.16 | rectangular |
| 6 | Polymer 6 (80) | PAG 1 (1) | — | TEA (0.125) | PGMEA (480) | 34.0 | 0.16 | rectangular |
| 7 | Polymer 7 (80) | PAG 1 (1) | — | TEA (0.125) | PGMEA (480) | 38.0 | 0.16 | rectangular |
| 8 | Polymer 8 (80) | PAG 1 (1) | — | TEA (0.125) | PGMEA (480) | 34.0 | 0.17 | rectangular |
| 9 | Polymer 9 (80) | PAG 1 (1) | — | TEA (0.125) | PGMEA (480) | 32.0 | 0.16 | rectangular |
| 10 | Polymer 10 (80) | PAG 1 (1) | — | TEA (0.125) | PGMEA (480) | 30.0 | 0.16 | rectangular |
| 11 | Polymer 11 (80) | PAG 1 (1) | — | TEA (0.125) | PGMEA (480) | 34.0 | 0.16 | rectangular |
| 12 | Polymer 12 (80) | PAG 1 (1) | — | TEA (0.125) | PGMEA (480) | 36.0 | 0.16 | rectangular |
| 13 | Polymer 1 (80) | PAG 2 (1) | — | TEA (0.125) | PGMEA (480) | 38.0 | 0.16 | rectangular |
| 14 | Polymer 1 (80) | PAG 2 (1) | — | TMMEA (0.236) | PGMEA (480) | 38.0 | 0.15 | rectangular |
| 15 | Polymer 1 (80) | PAG 2 (1) | — | TMEMEA (0.347) | PGMEA (480) | 40.0 | 0.16 | rectangular |
| 16 | Polymer 5 (70) | PAG 2 (1) | DRR 1 (10) | TMMEA (0.236) | PGMEA (480) | 32.0 | 0.17 | somewhat rounded head |
| 17 | Polymer 5 (70) | PAG 2 (1) | DRR 2 (10) | TMMEA (0.236) | PGMEA (480) | 34.0 | 0.16 | rectangular |
| 18 | Polymer 5 (70) | PAG 2 (1) | DRR 3 (10) | TMMEA (0.236) | PGMEA (480) | 40.0 | 0.16 | rectangular |
| 19 | Polymer 5 (70) | PAG 2 (1) | DRR 4 (10) | TMMEA (0.236) | PGMEA (480) | 34.0 | 0.16 | rectangular |
| 20 | Polymer 6 (80) | PAG 2 (1) | ACC 1 (4) | TMMEA (0.236) | PGMEA (480) | 32.0 | 0.17 | somewhat rounded head |
| 21 | Polymer 6 (80) | PAG 2 (1) | ACC 2 (4) | TMMEA (0.236) | PGMEA (480) | 36.0 | 0.16 | rectangular |

TABLE 2

| Example | Resin (pbw) | Photoacid generator (pbw) | Dissolution regulator (pbw) | Basic compound (pbw) | Solvent (pbw) | Eop, mJ/cm$^2$ | Resolution, μm | Shape |
|---|---|---|---|---|---|---|---|---|
| 22 | Polymer 13 (80) | PAG 1 (1) | — | TEA (0.125) | PGMEA (480) | 36.0 | 0.16 | rectangular |
| 23 | Polymer 14 (80) | PAG 1 (1) | — | TEA (0.125) | PGMEA (480) | 38.0 | 0.16 | rectangular |
| 24 | Polymer 15 (80) | PAG 1 (1) | — | TEA (0.125) | PGMEA (480) | 34.0 | 0.16 | rectangular |
| 25 | Polymer 16 (80) | PAG 1 (1) | — | TEA (0.125) | PGMEA (480) | 32.0 | 0.16 | rectangular |
| 26 | Polymer 17 (80) | PAG 1 (1) | — | TEA (0.125) | PGMEA (480) | 32.0 | 0.16 | rectangular |
| 27 | Polymer 18 (80) | PAG 1 (1) | — | TEA (0.125) | PGMEA (480) | 28.0 | 0.16 | rectangular |
| 28 | Polymer 19 (80) | PAG 1 (1) | — | TEA (0.125) | PGMEA (480) | 36.0 | 0.15 | rectangular |
| 29 | Polymer 20 (80) | PAG 1 (1) | — | TEA (0.125) | PGMEA (480) | 38.0 | 0.16 | rectangular |
| 30 | Polymer 13 (80) | PAG 2 (1) | — | TEA (0.125) | PGMEA (480) | 38.0 | 0.16 | rectangular |
| 31 | Polymer 13 (80) | PAG 2 (1) | — | TMMEA (0.236) | PGMEA (480) | 38.0 | 0.15 | rectangular |
| 32 | Polymer 13 (80) | PAG 2 (1) | — | TMEMEA (0.347) | PGMEA (480) | 40.0 | 0.16 | rectangular |
| 33 | Polymer 14 (70) | PAG 2 (1) | DRR 1 (10) | TMMEA (0.236) | PGMEA (480) | 36.0 | 0.17 | somewhat rounded head |
| 34 | Polymer 14 (70) | PAG 2 (1) | DRR 2 (10) | TMMEA (0.236) | PGMEA (480) | 38.0 | 0.16 | rectangular |
| 35 | Polymer 14 (70) | PAG 2 (1) | DRR 3 (10) | TMMEA (0.236) | PGMEA (480) | 44.0 | 0.16 | rectangular |
| 36 | Polymer 14 (70) | PAG 2 (1) | DRR 4 (10) | TMMEA (0.236) | PGMEA (480) | 38.0 | 0.16 | rectangular |
| 37 | Polymer 15 (80) | PAG 2 (1) | ACC 1 (4) | TMMEA (0.236) | PGMEA (480) | 34.0 | 0.16 | somewhat rounded head |
| 38 | Polymer 15 (80) | PAG 2 (1) | ACC 2 (4) | TMMEA (0.236) | PGMEA (480) | 38.0 | 0.16 | rectangular |

TABLE 3

| Example | Resin (pbw) | Photoacid generator (pbw) | Dissolution regulator (pbw) | Basic compound (pbw) | Solvent (pbw) | Eop, mJ/cm$^2$ | Resolution, μm | Shape |
|---|---|---|---|---|---|---|---|---|
| 39 | Polymer 21 (80) | PAG 1 (1) | — | TEA (0.125) | PGMEA (480) | 34.0 | 0.16 | rectangular |
| 40 | Polymer 22 (80) | PAG 1 (1) | — | TEA (0.125) | PGMEA (480) | 36.0 | 0.16 | rectangular |
| 41 | Polymer 23 (80) | PAG 1 (1) | — | TEA (0.125) | PGMEA (480) | 36.0 | 0.16 | rectangular |
| 42 | Polymer 24 (80) | PAG 1 (1) | — | TEA (0.125) | PGMEA (480) | 38.0 | 0.16 | rectangular |
| 43 | Polymer 25 (80) | PAG 1 (1) | — | TEA (0.125) | PGMEA (480) | 32.0 | 0.16 | rectangular |
| 44 | Polymer 26 (80) | PAG 1 (1) | — | TEA (0.125) | PGMEA (480) | 30.0 | 0.16 | rectangular |
| 45 | Polymer 27 (80) | PAG 1 (1) | — | TEA (0.125) | PGMEA (480) | 34.0 | 0.16 | rectangular |
| 46 | Polymer 28 (80) | PAG 1 (1) | — | TEA (0125) | PGMEA (480) | 36.0 | 0.16 | rectangular |
| 47 | Polymer 21 (80) | PAG 2 (1) | — | TEA (0.125) | PGMEA (480) | 36.0 | 0.16 | rectangular |
| 48 | Polymer 21 (80) | PAG 2 (1) | — | TMMEA (0.236) | PGMEA (480) | 36.0 | 0.15 | rectangular |
| 49 | Polymer 21 (80) | PAG 2 (1) | — | TMEMEA (0.347) | PGMEA (480) | 40.0 | 0.15 | rectangular |
| 50 | Polymer 22 (70) | PAG 2 (1) | DRR 1 (10) | TMMEA (0.236) | PGMEA (480) | 34.0 | 0.17 | somewhat rounded head |
| 51 | Polymer 22 (70) | PAG 2 (1) | DRR 2 (10) | TMMEA (0.236) | PGMEA (480) | 36.0 | 0.16 | rectangular |
| 52 | Polymer 22 (70) | PAG 2 (1) | DRR 3 (10) | TMMEA (0.236) | PGMEA (480) | 40.0 | 0.16 | rectangular |
| 53 | Polymer 22 (70) | PAG 2 (1) | DRR 4 (10) | TMMEA (0.236) | PGMEA (480) | 36.0 | 0.16 | rectangular |

TABLE 3-continued

| Example | Resin (pbw) | Photoacid generator (pbw) | Dissolution regulator (pbw) | Basic compound (pbw) | Solvent (pbw) | Eop, mJ/cm$^2$ | Resolution, μm | Shape |
|---|---|---|---|---|---|---|---|---|
| 54 | Polymer 23 (80) | PAG 2 (1) | ACC 1 (4) | TMMEA (0.236) | PGMEA (480) | 32.0 | 0.17 | somewhat rounded head |
| 55 | Polymer 23 (80) | PAG 2 (1) | ACC 2 (4) | TMMEA (0.236) | PGMEA (480) | 36.0 | 0.16 | rectangular |

It is seen from Tables 1 to 3 that the resist compositions within the scope of the invention have a high sensitivity and resolution upon ArF excimer laser exposure.

Japanese Patent Application Nos. 2001-037247, 2001-037262 and 2001-037271 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A polymer comprising recurring units of the following general formula (1) and having a weight average molecular weight of 1,000 to 500,000,

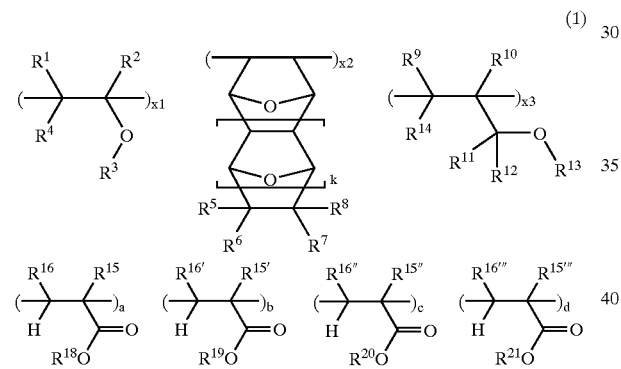

wherein $R^1$ and $R^2$ each are hydrogen or methyl, $R^3$ and $R^4$ each are hydrogen or a straight, branched or cyclic, monovalent hydrocarbon group of 1 to 15 carbon atoms which may contain a hetero atom, and $R^3$ and $R^4$ may bond together to form a ring, wherein $R^3$ and $R^4$ together represent a straight, branched or cyclic, divalent hydrocarbon group of 1 to 15 carbon atoms which may contain a hetero atom, each of $R^5$ to $R^8$ is hydrogen, a hydroxyl group or a straight, branched or cyclic, monovalent hydrocarbon group of 1 to 15 carbon atoms which may contain a hetero atom, at least one of $R^5$ to $R^8$ contains a hetero atom, any two of $R^5$ to $R^8$ may bond together to form a ring, wherein the ring forming two R's together represent a straight, branched or cyclic, divalent hydrocarbon group of 1 to 15 carbon atoms which may contain a hetero atom, $R^9$ and $R^{10}$ each are hydrogen or methyl, each of $R^{11}$ to $R^{14}$ is hydrogen or a straight, branched or cyclic, monovalent hydrocarbon group of 1 to 15 carbon atoms which may contain a hetero atom, a pair of $R^{11}$ and $R^{12}$, a pair of $R^{11}$ or $R^{12}$ and $R^{13}$, a pair of $R^{11}$ or $R^{12}$ and $R^{14}$, or a pair of $R^{13}$ and $R^{14}$ may bond together to form a ring, wherein each pair represents a straight, branched or cyclic, divalent hydrocarbon group of 1 to 15 carbon atoms which may contain a hetero atom, $R^{15}$ is hydrogen, methyl or $CH_2CO_2R^{17}$, $R^{15'}$ is hydrogen, methyl or $CH_2CO_2R^{17'}$, $R^{15''}$ is hydrogen, methyl or $CH_2CO_2R^{17''}$, $R^{15'''}$ is hydrogen, methyl or $CH_2CO_2R^{17'''}$, $R^{16}$ is hydrogen, methyl or $CO_2R^{17}$, $R^{16'}$ is hydrogen, methyl or $CO_2R^{17'}$, $R^{16''}$ is hydrogen, methyl or $CO_2R^{17''}$, $R^{16'''}$ is hydrogen, methyl or $CO_2R^{17'''}$, $R^{17}$, $R^{17'}$, $R^{17''}$ and $R^{17'''}$ may be identical or different between $R^{15}$ and $R^{16}$, between $R^{15'}$ and $R^{16'}$, between $R^{15''}$ and $R^{16''}$, and between $R^{15'''}$ and $R^{16'''}$, respectively, and each is a straight, branched or cyclic alkyl group of 1 to 15 carbon atoms, $R^{18}$ is hydrogen or a monovalent hydrocarbon group of 1 to 15 carbon atoms containing a carboxyl or hydroxyl group, $R^{19}$ is a monovalent hydrocarbon group of 2 to 15 carbon atoms containing at least one partial structure selected from the group consisting of ether, aldehyde, ketone, ester, carbonate, acid anhydride, amide and imide, $R^{20}$ is a polycyclic hydrocarbon group of 7 to 15 carbon atoms or an alkyl group containing a polycyclic hydrocarbon group, $R^{21}$ is an acid labile group, k is 0 or 1, x1, x2, x3, a, b, c and d represent a molar compositional ratio of the recurring units associated therewith, satisfying x1+x2+x3+a+b+c+d=1, x1, x2, x3, a, b and c are numbers inclusive of 0, d is a number of more than 0, provided that at least two of x1, x2 and x3 are not equal to 0.

2. A resist composition comprising the polymer of claim 1.

3. A process for forming a resist pattern comprising the steps of:

applying the resist composition of claim 2 onto a substrate to form a coating, heat treating the coating and then exposing it to high-energy radiation or electron beam through a photo mask, and optionally heat treating the exposed coating and developing it with a developer.

4. The polymer of claim 1 wherein the acid labile group represented by $R^{21}$ is an acid labile group selected from the group consisting of groups of the following general formulae (L1) to (L4):

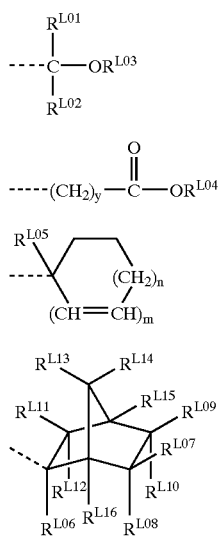

(L1)

(L2)

(L3)

(L4)

wherein the broken line denotes a free valence bond, $R^{L01}$ and $R^{L02}$ are hydrogen or straight, branched or cyclic alkyl groups of 1 to 18 carbon atoms, $R^{L03}$ is a monovalent hydrocarbon group of 1 to 18 carbon atoms which may contain a hetero atom, a pair of $R^{L01}$ and $R^{L02}$, $R^{L01}$ and $R^{L03}$, or $R^{L02}$ and $R^{L03}$ may form a ring, wherein each of $R^{L01}$, $R^{L02}$ and $R^{L03}$ is a straight or branched alkylene group of 1 to 18 carbon atoms when they form a ring, $R^{L04}$ is a tertiary alkyl group of 4 to 20 carbon atoms, a trialkylsilyl group in which each alkyl moiety has 1 to 6 carbon atoms, an oxoalky group of 4 to 20 carbon atoms, or a group of formula (L1), $R^{L05}$ is a monovalent hydrocarbon group of 1 to 8 carbon atoms which may contain a hetero atom or a substituted or unsubstituted aryl group of 6 to 20 carbon atoms, $R^{L06}$ is a monovalent hydrocarbon group of 1 to 8 carbon atoms which may contain a hetero atom or a substituted or unsubstituted aryl group of 6 to 20 carbon atoms, and $R^{L07}$ to $R^{L16}$ independently represent hydrogen or monovalent hydrocarbon groups of 1 to 15 carbon atoms which may contain a hetero atom, or $R^{L07}$ to $R^{L16}$, taken together, form a ring, wherein each of $R^{L07}$ to $R^{L16}$ represents a divalent $C_1$–$C_{15}$ hydrocarbon group which may contain a hetero atom, when they form a ring, or two of $R^{L07}$ to $R^{L16}$ which are attached to adjoining carbon atoms may bond together directly to form a double bond.

5. A polymer comprising recurring units of the following general formula (1a) and having a weight average molecular weight of 1,000 to 500,000,

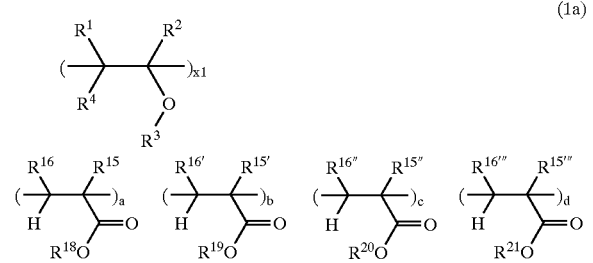

(1a)

wherein $R^1$ and $R^2$ each are hydrogen or methyl, $R^3$ is hydrogen or a straight, branched or cyclic, monovalent hydrocarbon group of 1 to 15 carbon atoms or a straight, branched or cyclic, monovalent hydrocarbon group of 3 to 15 carbon atoms which may contain a hetero atom; and $R^4$ is hydrogen or a straight, branched or cyclic, monovalent hydrocarbon group of 1 to 15 carbon atoms which may contain a hetero atom, or $R^3$ and $R^4$ may bond together to form a ring, wherein $R^3$ and $R^4$ together represent a straight, branched or cyclic, divalent hydrocarbon group of 1 to 15 carbon atoms which may contain a hetero atom, provided that $R^3$ and $R^4$ together do not form:

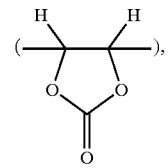

$R^{15}$ is hydrogen, methyl or $CH_2CO_2R^{17}$,
$R^{15'}$ is hydrogen, methyl or $CH_2CO_2R^{17'}$,
$R^{15''}$ is hydrogen, methyl or $CH_2CO_2R^{17''}$,
$R^{15'''}$ is hydrogen, methyl or $CH_2CO_2R^{17'''}$,
$R^{16}$ is hydrogen, methyl or $CO_2R^{17}$,
$R^{16'}$ is hydrogen, methyl or $CO_2R^{17'}$,
$R^{16''}$ is hydrogen, methyl or $CO_2R^{17''}$,
$R^{16'''}$ is hydrogen, methyl or $CO_2R^{17'''}$,
$R^{17}$, $R^{17'}$, $R^{17''}$ and $R^{17'''}$ may be identical or different between $R^{15}$ and $R^{16}$, between $R^{15'}$ and $R^{16'}$, between $R^{15''}$ and $R^{16''}$, and between $R^{15'''}$ and $R^{16'''}$, respectively, and each is a straight, branched or cyclic alkyl group of 1 to 15 carbon atoms, $R^{18}$ is hydrogen or a monovalent hydrocarbon group of 1 to 15 carbon atoms containing a carboxyl or hydroxyl group, $R^{19}$ is a monovalent hydrocarbon group of 2 to 15 carbon atoms containing at least one partial structure selected from the group consisting of ether, aldehyde, ketone, ester, carbonate, acid anhydride, amide and imide, $R^{20}$ is a polycyclic hydrocarbon group of 7 to 15 carbon atoms or an alkyl group containing a polycyclic hydrocarbon group, $R^{21}$ is an acid labile group selected from the group consisting of groups of the following general formulae (L1) to (L4):

(L1)

(L2)

(L3)

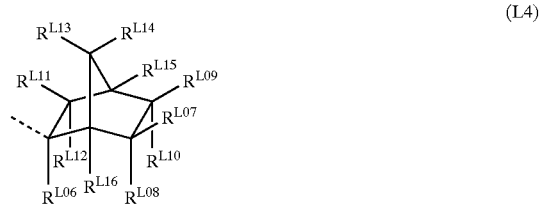

(L4)

wherein the broken line denotes a free valence bond, $R^{L01}$ and $R^{L02}$ are hydrogen or straight, branched or cyclic alkyl groups of 1 to 18 carbon atoms, $R^{L03}$ is a monovalent hydrocarbon group of 1 to 18 carbon atoms which may contain a hetero atom, a pair of $R^{L01}$ and $R^{L02}$, $R^{L01}$ and $R^{L03}$, or $R^{L02}$ and $R^{L03}$ may form a ring, wherein each of $R^{L01}$, $R^{L02}$ and $R^{L03}$ is a straight or branched alkylene group of 1 to 18 carbon atoms when they form a ring, $R^{L04}$ is a tertiary alkyl group of 4 to 20 carbon atoms, a trialkylsilyl group in which each alkyl moiety has 1 to 6 carbon atoms, an oxoalkyl group of 4 to 20 carbon atoms, or a group of formula (L1), $R^{L05}$ is a monovalent hydrocarbon group of 1 to 8 carbon atoms which may contain a hetero atom or a substituted or unsubstituted aryl group of 6 to 20 carbon atoms, $R^{L06}$ is a monovalent hydrocarbon group of 1 to 8 carbon atoms which may contain a hetero atom or a substituted or unsubstituted aryl group of 6 to 20 carbon atoms, and $R^{L07}$ to $R^{L16}$ independently represent hydrogen or monovalent hydrocarbon groups of 1 to 15 carbon atoms which may contain a hetero atom, or $R^{L07}$ to $R^{L16}$, taken together, form a ring, wherein each of $R^{L07}$ to $R^{L16}$ represents a divalent $C_1-C_{15}$ hydrocarbon group which may contain a hetero atom, when they form a ring, or two of $R^{L01}$ to $R^{L16}$ which are attached to adjoining carbon atoms may bond together directly to form a double bond, k is 0 or 1, x1, a, b, c and d represent a molar compositional ratio of the recurring units associated therewith, satisfying x1+a+b+c+d=1, a, b and c are numbers inclusive of 0, d is a number of more than 0, x1 is a number not equal to 0.

6. A resist composition comprising the polymer of claim 5.

7. A process for forming a resist pattern comprising the steps of:
applying the resist composition of claim 6 onto a substrate to form a coating,
heat treating the coating and then exposing it to high-energy radiation or electron beam through a photo mask, and optionally heat treating the exposed coating and developing it with a developer.

8. The polymer of claim 5, wherein in formula (1a),
$R^3$ is hydrogen or a straight, branched or cyclic, monovalent hydrocarbon group of 1 to 15 carbon atoms or a group selected from those of the following formulae:

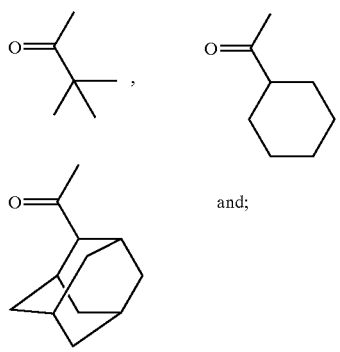

$R^4$ is hydrogen or a straight, branched or cyclic, monovalent hydrocarbon group of 1 to 15 carbon atoms which may contain a hetero atom, or $R^3$ and $R^4$ may bond together to form a ring, wherein $R^3$ and $R^4$ together represent a straight, branched or cyclic, divalent hydrocarbon group of 1 to 15 carbon atoms which may contain a hetero atom.

9. A polymer comprising recurring units of the following general formula (1) and having a weight average molecular weight of 1,000 to 500,000,

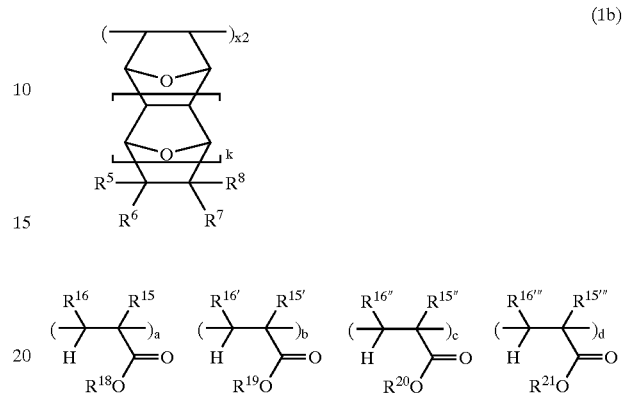

wherein each of $R^5$ to $R^8$ is hydrogen, a hydroxyl group or a straight, branched or cyclic, monovalent hydrocarbon group of 1 to 15 carbon atoms which may contain a hetero atom, at least one of $R^5$ to $R^8$ contains a hetero atom, any two of $R^5$ to $R^8$ may bond together to form a ring, wherein the ring-forming two R's together represent a straight, branched or cyclic, divalent hydrocarbon group of 1 to 15 carbon atoms which may contain a hetero atom, $R^{15}$ is hydrogen, methyl or $CH_2CO_2R^{17}$, $R^{15'}$ is hydrogen, methyl or $CH_2CO_2R^{17'}$, $R^{15''}$ is hydrogen, methyl or $CH_2CO_2R^{17''}$, $R^{15'''}$ is hydrogen, methyl or $CH_2CO_2R^{17'''}$, $R^{16}$ is hydrogen, methyl or $CO_2R^{17}$, $R^{16'}$ is hydrogen, methyl or $CO_2R^{17'}$, $R^{16''}$ is hydrogen, methyl or $CO_2R^{17''}$, $R^{16'''}$ is hydrogen, methyl or $CO_2R^{17'''}$, $R^{17}$, $R^{17'}$, $R^{17''}$ and $R^{17'''}$ may be identical or different between $R^{15}$ and $R^{16}$, between $R^{15'}$ and $R^{16'}$, between $R^{15''}$ and $R^{16''}$, and between $R^{15'''}$ and $R^{16'''}$, respectively, and each is a straight, branched or cyclic alkyl group of 1 to 15 carbon atoms, $R^{18}$ is hydrogen or a monovalent hydrocarbon group of 1 to 15 carbon atoms containing a carboxyl or hydroxyl group, $R^{19}$ is a monovalent hydrocarbon group of 2 to 15 carbon atoms containing at least one partial structure selected from the group consisting of ether, aldehyde, ketone, ester, carbonate, acid anhydride, amide and imide, $R^{20}$ is a polycyclic hydrocarbon group of 7 to 15 carbon atoms or an alkyl group containing a polycyclic hydrocarbon group, $R^{21}$ is an acid labile group selected from the group consisting of groups of the following general formulae (L1) to (L4):

-continued

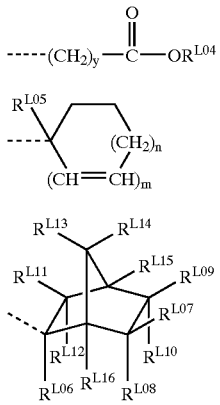

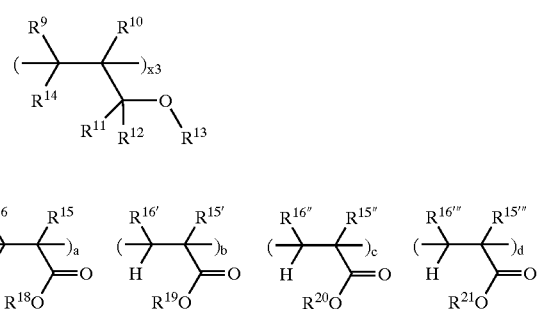

wherein the broken line denotes a free valence bond, $R^{L01}$ and $R^{L02}$ are hydrogen or straight, branched or cyclic alkyl groups of 1 to 18 carbon atoms, $R^{L03}$ is a monovalent hydrocarbon group of 1 to 18 carbon atoms which may contain a hetero atom, a pair of $R^{L01}$ and $R^{L02}$, $R^{L01}$ and $R^{L03}$, or $R^{L02}$ and $R^{L03}$ may form a ring, wherein each of $R^{L01}$, $R^{L02}$ and $R^{L03}$ is a straight or branched alkylene group of 1 to 18 carbon atoms when they form a ring, $R^{L04}$ is a tertiary alkyl group of 4 to 20 carbon atoms, a trialkylsilyl group in which each alkyl moiety has 1 to 6 carbon atoms, an oxoalkyl group of 4 to 20 carbon atoms, or a group of formula (L1), $R^{L05}$ is a monovalent hydrocarbon group of 1 to 8 carbon atoms which may contain a hetero atom or a substituted or unsubstituted aryl group of 6 to 20 carbon atoms, $R^{L06}$ is a monovalent hydrocarbon group of 1 to 8 carbon atoms which may contain a hetero atom or a substituted or unsubstituted aryl group of 6 to 20 carbon atoms, and $R^{L07}$ to $R^{L16}$ independently represent hydrogen or monovalent hydrocarbon groups of 1 to 15 carbon atoms which may contain a hetero atom, or $R^{L07}$ to $R^{L16}$, taken together, form a ring, wherein each of $R^{L07}$ to $R^{L16}$ represents a divalent $C_1$–$C_{15}$ hydrocarbon group which may contain a hetero atom, when they form a ring, or two of $R^{L07}$ to $R^{L16}$ which are attached to adjoining carbon atoms may bond together directly to form a double bond, k is 0 or 1, x2, a, b, c and d represent a molar compositional ratio of the recurring units associated therewith, satisfying x2+a+b+c+d=1, a, b and c are numbers inclusive of 0, d is a number of more than 0, x2 is a number not equal to 0.

10. A resist composition comprising the polymer of claim 9.

11. A process for forming a resist pattern comprising the steps of:
applying the resist composition of claim 9 onto a substrate to form a coating,
heat treating the coating and then exposing it to high-energy radiation or electron beam through a photo mask, and
optionally heat treating the exposed coating and developing it with a developer.

12. A polymer comprising recurring units of the following general formula (1c) and having a weight average molecular weight of 1,000 to 500,000, wherein $R^9$ and $R^{10}$ each are hydrogen or methyl, each of $R^{11}$ to $R^{12}$ is hydrogen or a straight, branched or cyclic, monovalent hydrocarbon group of 1 to 15 carbon atoms, each of $R^{13}$ to $R^{14}$ is hydrogen or a straight, branched or cyclic, monovalent hydrocarbon group of 1 to 15 carbon atoms which may contain a hetero atom, a pair of $R^{11}$ and $R^{12}$, a pair of $R^{11}$ or $R^{12}$ and $R^{13}$, a pair of $R^{11}$ or $R^{12}$ and $R^{14}$, or a pair of $R^{13}$ and $R^{14}$ may bond together to form a ring, wherein each pair represents a straight, branched or cyclic, divalent hydrocarbon group of 1 to 15 carbon atoms which may contain a hetero atom, $R^{15}$ is hydrogen, methyl or $CH_2CO_2R^{17}$, $R^{15'}$ is hydrogen, methyl or $CH_2CO_2R^{17'}$, $R^{15''}$ is hydrogen, methyl or $CH_2CO_2R^{17''}$, $R^{15'''}$ is hydrogen, methyl or $CH_2CO_2R^{17'''}$, $R^{16}$ is hydrogen, methyl or $CO_2R^{17}$, $R^{16'}$ is hydrogen, methyl or $CO_2R^{17'}$, $R^{16''}$ is hydrogen, methyl or $CO_2R^{17''}$, $R^{16'''}$ is hydrogen, methyl or $CO_2R^{17'''}$, $R^{17}$, $R^{17'}$, $R^{17''}$ and $R^{17'''}$ may be identical or different between $R^{15}$ and $R^{16}$, between $R^{15'}$ and $R^{16'}$, between $R^{15''}$ and $R^{16''}$, and between $R^{15'''}$ and $R^{16'''}$, respectively, and each is a straight, branched or cyclic alkyl group of 1 to 15 carbon atoms, $R^{18}$ is hydrogen or a monovalent hydrocarbon group of 1 to 15 carbon atoms containing a carboxyl or hydroxyl group, $R^{19}$ is a monovalent hydrocarbon group of 2 to 15 carbon atoms containing at least one partial structure selected from the group consisting of ether, aldehyde, ketone, ester, carbonate, acid anhydride, amide and imide, $R^{20}$ is a polycyclic hydrocarbon group of 7 to 15 carbon atoms or an alkyl group containing a polycyclic hydrocarbon group, $R^{21}$ is an acid labile group selected from the group consisting of groups of the following general formulae (L1) to (L4):

(L1)

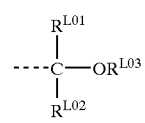

(L2)

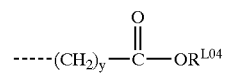

-continued

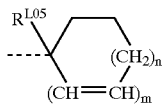
(L3)

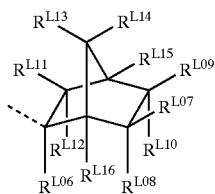
(L4)

wherein the broken line denotes a free valence bond, $R^{L01}$ and $R^{L02}$ are hydrogen or straight, branched or cyclic alkyl groups of 1 to 18 carbon atoms, $R^{L03}$ is a monovalent hydrocarbon group of 1 to 18 carbon atoms which may contain a hetero atom, a pair of $R^{L01}$ and $R^{L02}$, $R^{L01}$ and $R^{L03}$, or $R^{L02}$ and $R^{L03}$ may form a ring, wherein each of $R^{L01}$, $R^{L02}$ and $R^{L03}$ is a straight or branched alkylene group of 1 to 18 carbon atoms when they form a ring, $R^{L04}$ is a tertiary alkyl group of 4 to 20 carbon atoms, a trialkylsilyl group in which each alkyl moiety has 1 to 6 carbon atoms, an oxoalkyl group of 4 to 20 carbon atoms, or a group of formula (L1), $R^{L05}$ is a monovalent hydrocarbon group of 1 to 8 carbon atoms which may contain a hetero atom or a substituted or unsubstituted aryl group of 6 to 20 carbon atoms, $R^{L06}$ is a monovalent hydrocarbon group of 1 to 8 carbon atoms which may contain a hetero atom or a substituted or unsubstituted aryl group of 6 to 20 carbon atoms, and $R^{L07}$ to $R^{L16}$ independently represent hydrogen or monovalent hydrocarbon groups of 1 to 15 carbon atoms which may contain a hetero atom, or $R^{L07}$ to $R^{L16}$, taken together, form a ring, wherein each of $R^{L07}$ to $R^{L16}$ represents a divalent $C_1$–$C_{15}$, hydrocarbon group which may contain a hetero atom, when they form a ring, or two of $R^{L07}$ to $R^{L16}$ which are attached to adjoining carbon atoms may bond together directly to form a double bond, k is 0 or 1, x3, a, b, c and d represent a molar compositional ratio of the recurring units associated therewith, satisfying x3+a+b+c+d=1, a, b and c are numbers inclusive of 0, d is a number of more than 0, and x3 is a number not equal to 0.

13. A resist composition comprising the polymer of claim 12.

14. A process for forming a resist pattern comprising the steps of:

applying the resist composition of claim 12 onto a substrate to form a coating, heat treating the coating and then exposing it to high-energy radiation or electron beam through a photo mask, and optionally heat treating the exposed coating and developing it with a developer.

* * * * *